US012666845B2

(12) United States Patent
Lee

(10) Patent No.: US 12,666,845 B2
(45) Date of Patent: Jun. 23, 2026

(54) LIGHT EMITTING DISPLAY DEVICE

(71) Applicant: LG DISPLAY CO., LTD., Seoul (KR)

(72) Inventor: Joon Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 343 days.

(21) Appl. No.: 18/212,957

(22) Filed: Jun. 22, 2023

(65) Prior Publication Data

US 2023/0422579 A1 Dec. 28, 2023

(30) Foreign Application Priority Data

Jun. 27, 2022 (KR) ........................ 10-2022-0078470

(51) Int. Cl.
| | |
|---|---|
| *H10K 59/80* | (2023.01) |
| *H10K 59/122* | (2023.01) |
| *H10K 59/123* | (2023.01) |
| *H10K 59/124* | (2023.01) |
| *H10K 59/131* | (2023.01) |

(52) U.S. Cl.
CPC ..... *H10K 59/80522* (2023.02); *H10K 59/122* (2023.02); *H10K 59/123* (2023.02); *H10K 59/124* (2023.02); *H10K 59/1315* (2023.02); *H10K 59/873* (2023.02)

(58) Field of Classification Search
CPC ........... H10K 59/80522; H10K 59/122; H10K 59/123; H10K 59/124; H10K 59/1315; H10K 59/873; H10K 59/131; H10K 59/1201; H10K 59/80521; H10K 50/81;

H10K 50/82; H10K 50/844; H10K 71/00; H10D 86/021; H10D 86/451; H10D 86/441; H10H 20/831; H10H 20/852; H10H 29/142
See application file for complete search history.

(56) References Cited

U.S. PATENT DOCUMENTS

| | | | | |
|---|---|---|---|---|
| 2016/0351851 A1* | 12/2016 | Lee | ...................... | H10K 59/353 |
| 2018/0097047 A1* | 4/2018 | Jung | ................... | H10K 59/122 |
| 2019/0115403 A1* | 4/2019 | Kang | .................. | H10D 86/423 |
| 2019/0172898 A1* | 6/2019 | Choi | ................... | H10K 50/822 |

FOREIGN PATENT DOCUMENTS

| | | |
|---|---|---|
| KR | 20160141175 A | 12/2016 |
| KR | 10-2019-0079954 A | 7/2019 |
| KR | 10-2021-0081784 A | 7/2021 |

OTHER PUBLICATIONS

Office Action in Korean Appln. No. 10-2022-0078470, mailed on Jan. 2, 2026, 16 pages (with English translation).

* cited by examiner

*Primary Examiner* — Elmito Breval

(74) *Attorney, Agent, or Firm* — Fish & Richardson P.C.

(57) ABSTRACT

Disclosed is a light emitting display device including a substrate, an auxiliary power electrode located on the substrate, a first protection layer located on the auxiliary power electrode, a second protection layer located between the first protection layer and the auxiliary power electrode, a contact portion configured to expose a part of the auxiliary power electrode through the first protection layer and the second protection layer, an eaves structure portion located at the contact portion, and a cover metal pattern located on the eaves structure portion.

20 Claims, 17 Drawing Sheets

A

A

PAS_P

BA

APE

OC

III — — III'

PAS

UC   OC_P   ECP

LIGHT EMITTING DISPLAY DEVICE

CROSS-REFERENCE TO RELATED APPLICATION

This application claims the benefit of Korean Patent Application No. 10-2022-0078470, filed on Jun. 27, 2022, which is hereby incorporated by reference as if fully set forth herein.

BACKGROUND

Field of the Disclosure

The present disclosure relates to a light emitting display device.

Discussion of the Related Art

With growth of an information society, demand for display devices that display images has increased. In recent years, various display devices, such as a liquid crystal display (LCD) device, an organic light emitting display (OLED) device, a micro-light emitting diode (micro-LED) display device, and a quantum dot display (QD) device, have been used.

Among the display devices, a light emitting display device is generally classified as an inorganic light emitting display device or an organic light emitting display device based on the material of a light emitting layer. For example, the organic light emitting display device is a self-luminance type display device, wherein holes from an anode for hole injection and electrons from a cathode for electron injection are injected into a light emitting layer, and the electrons and the holes are combined, whereby excitons are generated, and light is emitted as the generated excitons are lowered from an excited state to a ground state, and therefore an image is displayed.

Based on the direction in which light is emitted, the light emitting display device may be classified as a top emission type light emitting display device, a bottom emission type light emitting display device, or a dual emission type light emitting display device.

In the top emission type light emitting display device, a translucent electrode or a transparent electrode is used as the cathode to emit light from the light emitting layer upwards. The cathode is formed to have a small thickness to improve transmittance, whereby electrical resistance is increased. Particularly, in a large-area light emitting display device, a voltage drop based on increased distance from a voltage supply pad unit, which leads to nonuniformity in luminance of the light emitting display device.

SUMMARY

In some aspects, a cathode contact structure having an undercut shape formed such that a separate auxiliary electrode is electrically connected to the cathode has been proposed. The cathode with an undercut shape may prevent voltage drop and damage due to gas leakage.

To prevent loosening of a structure having an undercut shape, the undercut structure is implemented using an overcoat layer and a passivation layer that have relatively excellent adhesive characteristics. During formation of the undercut structure, however, loosening of the edge of an overcoat layer pattern occurs, which increases patterning time and etching area necessary to form the undercut structure.

In addition, gas contained in a filler configured to protect a light emitting element from external moisture or oxygen permeates the undercut structure is then immediately discharged from the undercut structure. If the gas permeates the light emitting element, the light emitting element may fail and become a failed pixel that appears as a dark dot.

It is an object of the present disclosure to provide a light emitting display device capable of preventing loosening of the edge of an overcoat layer pattern of an undercut structure in a cathode contact structure to reduce patterning time and etching area necessary to form the undercut structure.

It is another object of the present disclosure to provide a light emitting display device having a cathode contact structure configured to capture gas generated from a filler in an undercut structure to protect a light emitting element.

In addition to the above objects of the present disclosure, other features and advantages of the present disclosure will be clearly understood by a person having ordinary skill in the art to which the present disclosure pertains from the following description.

A light emitting display device according to an aspect of the present disclosure includes a substrate, an auxiliary power electrode located on the substrate, a first protection layer located on the auxiliary power electrode, a second protection layer located between the first protection layer and the auxiliary power electrode, a contact portion configured to expose a part of the auxiliary power electrode through the first protection layer and the second protection layer, an eaves structure portion located at the contact portion, and a cover metal pattern located on the eaves structure portion.

A light emitting display device according to another aspect of the present disclosure includes a substrate including an active area in which subpixels are located and a non-active area adjacent to the active area, an auxiliary power electrode located between the subpixels, and an undercut structure located on the auxiliary power electrode, wherein the undercut structure includes a first pattern located on the auxiliary power electrode, a second pattern configured to support the first pattern, and a cover metal pattern configured to cover the entire upper surface of the first pattern.

A method of manufacturing a light emitting display device according to a further aspect of the present disclosure includes forming an auxiliary power electrode on a substrate, forming a passivation material layer on the auxiliary power electrode, forming a first pattern and an overcoat layer on the passivation material layer, forming a cover metal material layer on the first pattern and the overcoat layer, patterning the cover metal material layer, and removing the passivation material layer under the patterned cover metal material layer to form an undercut area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect (s) of the disclosure and together with the description serve to explain the principle of the disclosure. In the drawings.

DETAILED DESCRIPTION

Figure 1:
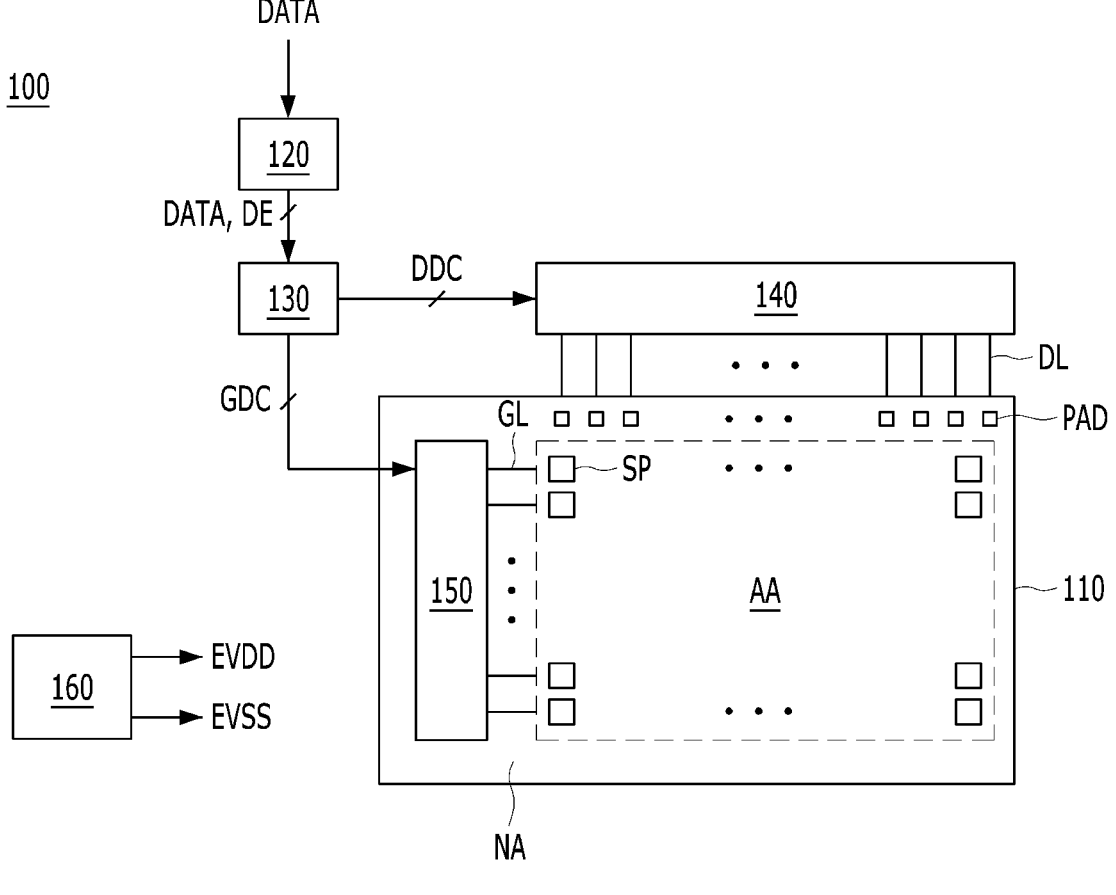
FIG. 1 is a block diagram schematically showing a light emitting display device according to an aspect of the present disclosure.

Advantages and features of the present disclosure and methods of achieving the same will be more clearly understood from embodiments described below with reference to the accompanying drawings. However, the present disclosure is not limited to the following embodiments and may be implemented in various different forms. The embodiments are provided merely to complete the disclosure of the present disclosure and to fully inform a person having ordinary skill in the art to which the present disclosure pertains of the category of the disclosure. The disclosure is defined only by the category of the claims.

In the drawings for explaining various embodiments of the present disclosure, for example, the illustrated shape, size, ratio, angle, and number are given by way of example, and thus, are not limitative of the disclosure of the present disclosure. Throughout the specification, the same reference numerals designate the same constituent elements. Also, in the following description of the present disclosure, a detailed description of known functions and configurations incorporated herein will be omitted when it may make the subject matter of the present disclosure rather unclear.

The terms "comprises", "includes", and/or "has", used in the specification, do not preclude the presence or addition of other elements unless used along with the term "only". The singular forms are intended to include the plural forms as well, unless the context clearly indicates otherwise.

In the interpretation of constituent elements, the constituent elements are interpreted as including an error range even if there is no explicit description thereof.

When describing positional relationships, for example, when the positional relationship between two parts is described using "on", "above", "below", "aside", or the like, one or more other parts may be located between the two parts unless the term "directly" or "closely" is used therewith.

When describing temporal relationships, for example, when the temporal relationship between two actions is described using "after", "subsequently", "next", "before", or the like, the actions may not occur in succession unless the term "immediately" or "directly" is used therewith.

Although terms such as, for example, "first" and "second" may be used to describe various elements, these elements are not limited by the terms. These terms are used to distinguish one element from another element. In the following description, therefore, a first element may be a second element within the technical idea of the present disclosure.

The terms "first horizontal axis direction", "second horizontal axis direction", and "vertical axis direction" should not be interpreted as only geometrical relationships in which they are perpendicular to each other, and may have wider directivities within a range in which the construction of the present disclosure is functionally operated.

The term "at least one" should be understood as including all combinations that may be presented from one or more related items. For example, "at least one of a first item, a second item, and a third item" may mean combinations of all items that may be presented from two or more, among the first item, the second item, and the third item, as well as the first item, the second item, or the third item.

The respective features of the various embodiments of the present disclosure may be partially or wholly coupled to and combined with each other, and various technical linkages therebetween and operation methods thereof are possible. These various embodiments may be performed independently of each other, or may be performed in association with each other.

Hereinafter, preferred embodiments of a light emitting display device according to the present disclosure will be described in detail with reference to the accompanying drawings. In the drawings, the same elements are denoted by the same reference numerals even when they are depicted in different drawings. In addition, the scale of elements shown in the accompanying drawings are different from actual scales for convenience of description and thus are not limited to the scales shown in the drawings.

FIG. 1 is a block diagram schematically showing a light emitting display device according to an aspect of the present disclosure.

As shown in FIG. 1, the light emitting display device 100 according to the aspect of the present disclosure may include a display panel 110, an image processing unit 120, a timing controller 130, a data driving unit 140, a scan driving unit 150, and a power supply unit 160.

The display panel 110 may display an image according to a data signal DATA supplied from the data driving unit 140, a scan signal supplied from the scan driving unit 150, and power supplied from the power supply unit 160.

The display panel 110 may include a subpixel SP disposed at each intersection between a plurality of gate lines GL and a plurality of data lines DL. The structure of the subpixel SP may be variously changed depending on kind of the light emitting display device 100.

For example, the subpixel SP may be formed as a top emission type subpixel, a bottom emission type subpixel, or a dual emission type subpixel depending on structure thereof. The subpixel SP corresponds to a unit pixel having a specific kind of color filter or a unit pixel capable of emitting an assigned color of light without a color filter.

For example, subpixels SP may include a red subpixel, a green subpixel, and a blue subpixel. Alternatively, the subpixels SP may include a red subpixel, a blue subpixel, a white subpixel, and a green subpixel. The subpixels SP may have one or more different light emission areas depending on light emission characteristics thereof.

One or more subpixels SP may constitute one unit pixel. For example, one unit pixel may include red, green, and blue subpixels, and the red, green, and blue subpixels may be repeatedly disposed. Alternatively, one unit pixel may include red, green, blue, and white subpixels, and the red, green, blue, and white subpixels may be repeatedly disposed. Alternatively, the red, green, blue, and white subpixels may be disposed in a quad structure. In the present disclosure, color type, disposition type, and disposition sequence of the subpixels may be variously configured depending on light emission characteristics, the lifespan of the element, and the specifications of the device, and the present disclosure is not limited thereto.

The display panel 110 may be divided into an active area AA in which the subpixels SP are disposed to display an image and a non-active area NA around the active area AA. The scan driving unit 150 may be mounted in the non-active area NA of the display panel 110. In addition, a pad electrode PAD may be disposed in the non-active area NA.

The image processing unit 120 may output the data signal DATA supplied from the outside and a data enable signal DE. The image processing unit 120 may output at least one of a vertical synchronization signal, a horizontal synchronization signal, and a clock signal, in addition to the data enable signal DE. These signals are omitted for convenience of description.

The timing controller 130 may receive a driving signal and the data signal DATA from the image processing unit 120. The driving signal may include the data enable signal DE. Alternatively, the driving signal may include the vertical synchronization signal, the horizontal synchronization signal, and the clock signal. The timing controller 130 may output a data timing control signal DDC for controlling operation timing of the data driving unit 140 and a gate timing control signal GDC for controlling operation timing of the scan driving unit 150 based on the driving signal.

The data driving unit 140 may sample, latch, and convert the data signal DATA supplied from the timing controller 130 into a gamma reference voltage and may output the gamma reference voltage in response to the data timing control signal DDC supplied from the timing controller 130.

The data driving unit 140 may output the data signal DATA through the data lines DL. The data driving unit 140 may be implemented in the form of an integrated circuit (IC). For example, the data driving unit 140 may be electrically connected to the pad electrode PAD disposed in the non-active area NA of the display panel 110 via a flexible circuit film.

The scan driving unit 150 may output the scan signal in response to the gate timing control signal GDC supplied form the timing controller 130. The scan driving unit 150 may output the scan signal through the gate lines GL. The scan driving unit 150 may be implemented in the form of an IC or in the form of a gate in panel (GIP) in the display panel 110.

The power supply unit 160 may output a high-potential voltage and a low-potential voltage for driving the display panel 110. The power supply unit 160 may supply the high-potential voltage to the display panel 110 via a first power line EVDD (e.g., a driving power line or a pixel power line) and may supply the low-potential voltage to the display panel 110 via a second power line EVSS (e.g., an auxiliary power line or a common power line).

Figure 2:
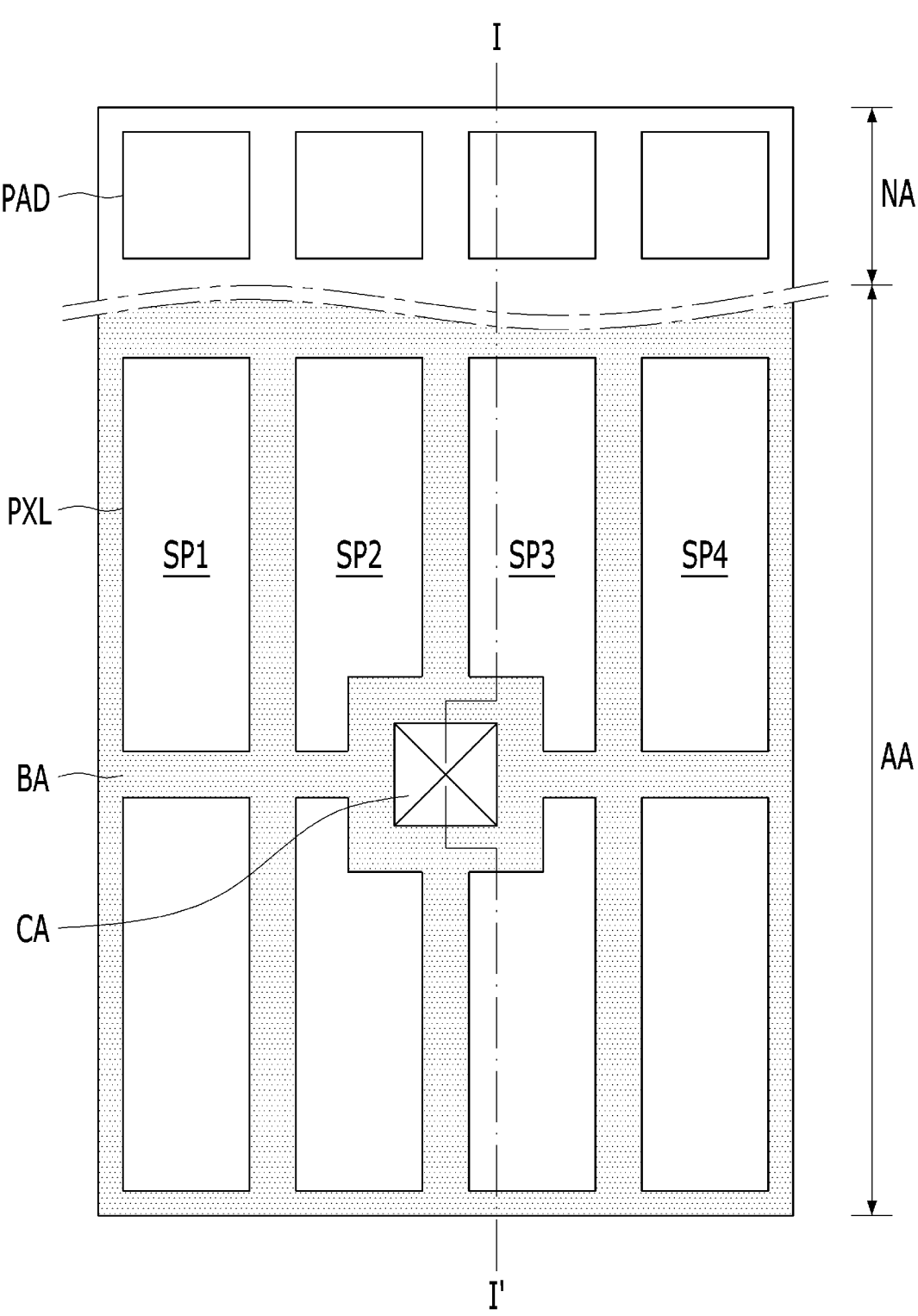
FIG. 2 is a partial plan view schematically showing an active area and a non-active area of the light emitting display device according to the aspect of the present disclosure.

FIG. 2 is a partial plan view schematically showing the active area and the non-active area of the light emitting display device according to the aspect of the present disclosure.

Referring to FIGS. 1 and 2, the display panel 110 of the light emitting display device according to the aspect of the present disclosure may be divided into the active area AA and the non-active area NA, and may include a plurality of subpixels SP1, SP2, SP3, and SP4 defined by the gate lines GL and the data lines DL intersecting each other in a matrix form on the substrate in the active area AA.

As shown in FIG. 2, the plurality of subpixels SP1, SP2, SP3, and SP4 may include a first subpixel SP1, a second subpixel SP2, a third subpixel SP3, and a fourth subpixel SP4. For example, the first subpixel SP1 may emit red light, the second subpixel SP2 may emit green light, the third subpixel SP3 may emit blue light, and the fourth subpixel SP4 may emit white light. However, the fourth subpixel SP4 that emits white light may be omitted, and subpixels configured to emit at least two of red light, green light, blue light, yellow light, magenta light, and cyan light may be used. In addition, each of the plurality of subpixels SP1, SP2, SP3, and SP4 may have a specific kind of color filter or may emit an assigned color of light without a color filter. However, the present disclosure is not limited thereto, and color, disposition type, and disposition sequence of the subpixels SP1, SP2, SP3, and SP4 may be variously configured depending on light emission characteristics, the lifespan of the element, and the specifications of the device.

A pixel electrode PXL (e.g., an anode or a first electrode) may be disposed at each of the plurality of subpixels SP1, SP2, SP3, and SP4. A bank layer BA is configured to cover the edge of the pixel electrode PXL and to define openings corresponding to the plurality of subpixels SP1, SP2, SP3, and SP4, and may be disposed on the pixel electrode PXL. A light emitting layer (or organic light emitting layer) and a common electrode (e.g., cathode or second electrode) may be sequentially stacked on the pixel electrode PXL and the bank layer BA.

In the aspect of the present disclosure, to reduce resistance of the common electrode formed over the entire surface of the display panel 110, a separate auxiliary power electrode may be included that is made of a material that exhibits lower resistance than the common electrode and electrically connected to the common electrode by contact. The bank layer BA may define a contact portion CA configured to expose a part of the auxiliary power electrode such that the auxiliary power electrode and the common electrode are electrically connected to each other.

The contact portion CA may be located in the active area AA, and may be surrounded by the subpixels SP1, SP2, SP3, and SP4. The contact portion CA may be formed for every four subpixels SP1, SP2, SP3, and SP4 constituting one unit pixel in a direction parallel to the gate lines GL, however, the present disclosure is not limited thereto. The contact portion may be formed for every arbitrary number of subpixels. In addition, the contact portion CA may be formed for every horizontal line in a direction parallel to the data lines DL, however, the present disclosure is not limited thereto. The contact portion may be formed for every arbitrary number of horizontal lines.

The pad electrode PAD may be formed in the non-active area NA adjacent to the end of the display panel 110. A pad electrode PAD may correspond to one subpixel, however, the present disclosure is not limited thereto.

Figure 3:
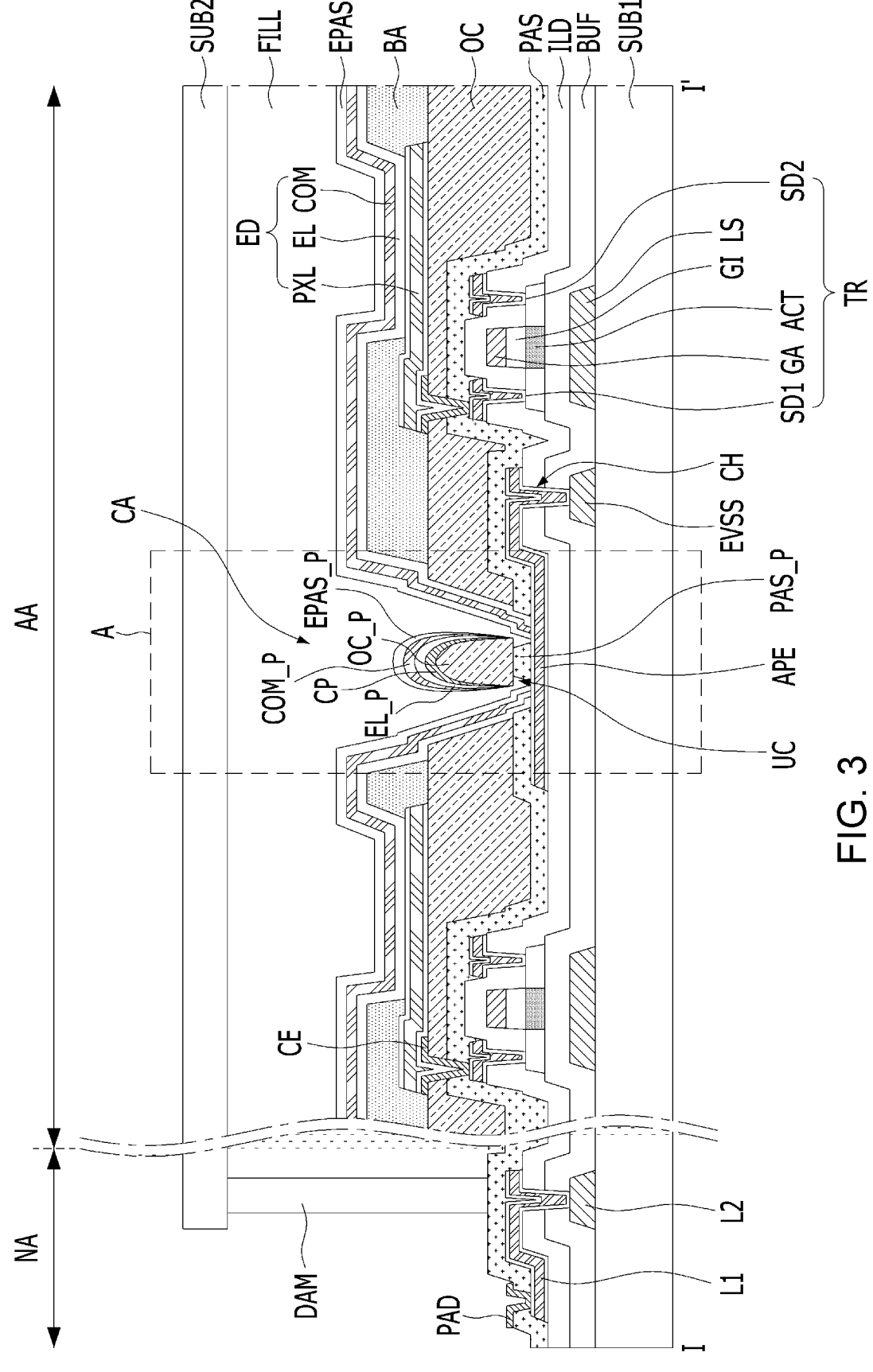
FIG. 3 is a cross-sectional view of the light emitting display device according to the aspect of the present disclosure, taken along line I-I' of FIG. 2.

FIG. 3 is a cross-sectional view of the light emitting display device taken along line I-I' of FIG. 2 according to the aspect of the present disclosure.

Referring to FIG. 3, the light emitting display device 100 according to the aspect of the present disclosure may include a first substrate SUB1, a light blocking layer LS, an auxiliary power line EVSS (e.g., a second power line or a common power line, etc.), a buffer layer BUF, a thin film transistor TR, a storage capacitor, a gate dielectric film GI, an interlayer dielectric film ILD, an auxiliary power electrode APE, a passivation layer PAS (e.g., a second protection layer, etc.), an overcoat layer OC (e.g., a first protection layer or planarization layer, etc.), a light emitting element ED, a bank layer BA, a contact portion CA, an undercut structure OC_P, PAS_P, and CP, an encapsulation layer EPAS, a filler FILL, a second substrate SUB2, a dam DAM, and a pad electrode PAD.

The first substrate SUB1 is a base substrate and may be made of glass or plastic. For example, the first substrate SUB1 may be made of plastic, such as polyimide (PI), polyethylene terephthalate (PET), polyethylene naphthalate (PEN), polycarbonate (PC), whereby the first substrate SUB1 may be flexible.

A circuit element including various signal lines, a thin film transistor TR, and a storage capacitor may be formed on the first substrate SUB1 for each of the plurality of subpixels SP1, SP2, SP3, and SP4. The signal lines may include a gate line GL, a data line DL, a first power line EVDD (e.g., a driving power line or a pixel power line), a second power line EVSS (e.g., an auxiliary power line or a common power line), and a reference line, and the thin film transistor TR may include a driving thin film transistor, a switching thin film transistor, and a sensing thin film transistor.

The light blocking layer LS and the auxiliary power line EVSS (e.g., a second power line or common power line) may be disposed on the first substrate SUB1. The light blocking layer LS may overlap the thin film transistor TR. For example, the light blocking layer LS may overlap an active layer ACT of the thin film transistor TR. Particularly, the light blocking layer LS may overlap a channel area of the active layer ACT in a plane. The light blocking layer LS may serve to prevent external light from entering the active layer ACT. In addition, the auxiliary power line EVSS (second power line or common power line) may apply a low voltage to the common electrode COM (cathode or second electrode). In addition, the auxiliary power line EVSS may reduce the resistance of the common electrode COM together with the auxiliary power electrode APE.

The light blocking layer LS and the auxiliary power line EVSS may be made of the same material on the same layer. In this case, the light blocking layer LS and the auxiliary power line EVSS may be simultaneously formed through the same process.

The buffer layer BUF may be disposed on the first substrate SUB1 to cover the light blocking layer LS and the auxiliary power line EVSS. The buffer layer BUF may be a single layer or may be a plurality of stacked inorganic films. For example, the buffer layer BUF may be a single layer made of a silicon oxide film (SiOx), a silicon nitride film (SiNx), or a silicon oxynitride film (SiOxNy). Alternatively, the buffer layer BUF may be a stack of at least two of a silicon oxide film (SiOx), a silicon nitride film (SiNx), or a silicon oxynitride film (SiOxNy). The buffer layer BUF may be formed over the upper surface of the first substrate SUB1 to block ions or impurities spread from the first substrate SUB1 and prevent permeation of moisture into the light emitting element ED through the first substrate SUB1.

The thin film transistor TR, the storage capacitor, and the auxiliary power electrode APE may be disposed on the buffer layer BUF. The thin film transistor TR may be disposed at each of the plurality of subpixels SP1, SP2, SP3, and SP4 on the buffer layer BUF. For example, the thin film transistor TR may include an active layer ACT, a gate electrode GA overlapping the active layer ACT in the state in which a gate dielectric film GI is interposed therebetween, a first source/drain electrode SD1, and a second source/drain electrode SD2. The storage capacitor may be formed in a triple structure in which a first capacitor electrode configured to use a part or the entirety of the light blocking layer LS or the auxiliary power line EVSS, a second capacitor electrode formed by patterning the same metal material as the gate electrode GA of the thin film transistor TR, and a third capacitor electrode configured to use a part or the entirety of the auxiliary power electrode APE overlap, however the present disclosure is not limited thereto. The storage capacitor may be implemented by various numbers of layers as needed. In addition, the auxiliary power electrode APE may be electrically connected to the auxiliary power line EVSS through a contact hole CH formed through the buffer layer BUF and the interlayer dielectric film ILD.

The active layer ACT of the thin film transistor TR may be made of a silicon-based or oxide-based semiconductor material and may be formed on the buffer layer BUF. The active layer ACT may include a channel area overlapping the gate electrode GA and a source/drain area connected to the first and second source/drain electrodes SD1 and SD2.

The gate dielectric film GI may be formed on the active layer ACT. The gate dielectric film GI may be disposed on the channel area of the active layer ACT and may serve to isolate the active layer ACT and the gate electrode GA from each other. The gate dielectric film GI may be made of an inorganic insulating material. For example, the gate dielectric film GI may be made of a silicon oxide film (SiOx), a silicon nitride film (SiNx), a silicon oxynitride film (SiOxNy), or a combination thereof.

The gate electrode GA may be formed on the gate dielectric film GI. The gate electrode GA may be disposed to face the active layer ACT with the gate dielectric film GI is interposed therebetween. The gate electrode GA may be formed in a single layer structure or a multilayer structure made of any one selected from the group consisting of copper (Cu), molybdenum (Mo), aluminum (Al), chromium (Cr), gold (Au), titanium (Ti), nickel (Ni), neodymium (Nd), tantalum (Ta), and tungsten (W) or an alloy thereof. In addition, the second capacitor electrode constituting a part of the storage capacitor may be made of the same material as the gate electrode GA on the buffer layer BUF. In this case, the gate electrode GA of the thin film transistor TR and the second capacitor electrode of the storage capacitor may be simultaneously formed through the same process.

The interlayer dielectric film ILD is configured to cover the gate electrode GA and may be formed on the buffer layer BUF. In addition, the interlayer dielectric film ILD may be formed to cover the second capacitor electrode of the storage capacitor. The interlayer dielectric film ILD may protect the thin film transistor TR. The interlayer dielectric film ILD may be made of an inorganic insulating material. For example, the interlayer dielectric film ILD may be a silicon oxide film (SiOx), a silicon nitride film (SiNx), a silicon oxynitride film (SiOxNy), or a combination thereof.

The first and second source/drain electrodes SD1 and SD2 may be formed on the interlayer dielectric film ILD. A predetermined area of the interlayer dielectric film ILD may be removed such that the active layer ACT and the first and second source/drain electrodes SD1 and SD2 contact each other. For example, the first and second source/drain electrodes SD1 and SD2 may be electrically connected to the active layer ACT through a contact hole formed through the interlayer dielectric film ILD.

The auxiliary power electrode APE may be formed on the interlayer dielectric film ILD. A predetermined area of each of the interlayer dielectric film ILD and the buffer layer BUF provided thereunder may be removed such that the auxiliary power line EVSS and the auxiliary power electrode APE contact each other. For example, the auxiliary power electrode APE may be electrically connected to the auxiliary power line EVSS through a contact hole CH formed through the interlayer dielectric film ILD and the buffer layer BUF. In addition, the auxiliary power electrode APE may serve as the third capacitor electrode of the storage capacitor.

The first and second source/drain electrodes SD1 and SD2 and the auxiliary power electrode APE may be made of the same material on the same layer. The first and second source/drain electrodes SD1 and SD2 and the auxiliary power electrode APE may be simultaneously formed through the same process. Each of the first and second source/drain electrodes SD1 and SD2 and the auxiliary power electrode APE may be formed in a single layer structure or a multilayer structure. When each of the first and second source/drain electrodes SD1 and SD2 and the auxiliary power electrode APE is formed in a single layer structure, any material selected from the group consisting of molybdenum (Mo), aluminum (Al), chromium (Cr), gold (Au), titanium (Ti), nickel (Ni), neodymium (Nd), and copper (Cu) or an alloy thereof may be used. In addition, when each of the first and second source/drain electrodes SD1 and SD2 and the auxiliary power electrode APE is formed in a multilayer structure, a dual layer of molybdenum/aluminum-neodymium, molybdenum/aluminum, titanium/aluminum, or copper/molytitanium may be used. Alternatively, each of the first and second source/drain electrodes SD1 and SD2 and the auxiliary power electrode APE may be formed in a triple-layer structure of molybdenum/aluminum-neodymium/molybdenum, molybdenum/aluminum/molybdenum, titanium/aluminum/titanium, or molytitanium/copper/molytitanium. However, the present disclosure is not limited thereto, and each of the first and second source/drain electrodes SD1 and SD2 and the auxiliary power electrode APE may be formed in a multilayer structure made of any one selected from the group consisting of molybdenum (Mo), aluminum (Al), chromium (Cr), gold (Au), titanium (Ti), nickel (Ni), neodymium (Nd), and copper (Cu) or an alloy thereof.

The thin film transistor TR, the storage capacitor, and the auxiliary power electrode APE disposed on the first substrate SUB1 may constitute a circuit layer (or thin film transistor array layer).

The passivation layer PAS (or second protection layer) may be disposed on the thin film transistor TR and the auxiliary power electrode APE. The passivation layer PAS may be formed to cover the thin film transistor TR and the auxiliary power electrode APE. The passivation layer PAS, which is configured to protect the thin film transistor TR, may be made of an inorganic insulating material. For example, the passivation layer PAS may be made of a silicon oxide film (SiOx), a silicon nitride film (SiNx), a silicon oxynitride film (SiOxNy), or a combination thereof.

The overcoat layer OC (e.g., first protection layer or planarization layer) may be disposed on the passivation layer PAS (or second protection layer). The overcoat layer OC, which is configured to planarize a lower step, may be made of an organic insulating material. For example, the overcoat layer OC may be made of at least one of organic materials, such as photo acrylic, polyimide, benzocyclobutene, and acrylate.

The pixel electrode PXL (e.g., an anode or a first electrode) may be disposed on the overcoat layer OC (first protection layer or planarization layer). The pixel electrode PXL (e.g., anode or first electrode) may be disposed at each of the plurality of subpixels SP1, SP2, SP3, and SP4 on the overcoat layer OC. The pixel electrode PXL may be connected to the first source/drain electrode SD1 of the thin film transistor TR through a contact hole formed through the overcoat layer OC and the passivation layer PAS. Alternatively, the pixel electrode PXL may be connected to the second source/drain electrode SD2 of the thin film transistor TR. The light emitting layer EL and the common electrode COM may be disposed on the pixel electrode PXL. The pixel electrode PXL, the light emitting layer EL, and the common electrode COM may constitute the light emitting element ED.

The pixel electrode PXL (anode or first electrode) may be made of a metal, an alloy thereof, or a combination of a metal and a metal oxide. For example, the pixel electrode PXL may be formed in a multilayer structure including a transparent conductive film and an opaque conductive film that exhibits high reflection efficiency. The transparent conductive film of the pixel electrode PXL may be made of a material that has a relatively large work function, such as indium tin oxide (ITO) or indium zinc oxide (IZO), and the opaque conductive film may be formed in a single layer structure or a multilayer structure made of any one selected from the group consisting of silver (Ag), aluminum (Al), copper (Cu), molybdenum (Mo), titanium (Ti), nickel (Ni), chromium (Cr), and tungsten (W) or an alloy thereof. For example, the pixel electrode PXL may be formed in a structure in which a transparent conductive film, an opaque conductive film, and a transparent conductive film are sequentially stacked or a structure in which a transparent conductive film and an opaque conductive film are sequentially stacked.

A connection electrode CE may be disposed between the thin film transistor TR and the pixel electrode PXL. That is, the pixel electrode PXL may be electrically connected to the thin film transistor TR via the connection electrode CE. The connection electrode CE may be formed on the overcoat layer OC and may be completely covered by the pixel electrode PXL. Specifically, the connection electrode CE may be formed under an end of the pixel electrode PXL.

The connection electrode CE may be made of a metal that exhibits high oxidation resistance. For example, the connection electrode CE may be made of a molybdenum titanium alloy (MoTi) or indium tin oxide (ITO). The connection electrode CE may reduce resistance between the thin film transistor TR and the pixel electrode PXL while protecting the first source/drain electrode SD1 of the thin film transistor TR exposed from the overcoat layer OC and the passivation layer PAS. The connection electrode CE may be made of the same material as a cover metal pattern CP, a description of which will follow, and/or the pad electrode PAD.

The bank layer BA may be disposed on the pixel electrode PXL and the overcoat layer OC. The bank layer BA may cover the edge of the pixel electrode PXL and may define the opening of the subpixel. The bank layer BA may be made of an organic material, such as polyimide, acrylate, or benzocyclobutene. A central part of the pixel electrode PXL exposed by the bank layer BA may be defined as a light emission area. In addition, the bank layer BA may completely cover the connection electrode CE, whereby the step of the pixel electrode PXL generated due to the connection electrode CE may be covered. In addition, the bank layer BA may define the contact portion CA configured to expose a part of the auxiliary power electrode APE such that the auxiliary power electrode APE and the common electrode COM are electrically connected to each other.

The contact portion CA may expose a part of the auxiliary power electrode APE through the passivation layer PAS, the overcoat layer OC, and the bank layer BA. An undercut structure OC_P, PAS_P, and CP having an undercut area UC may be disposed on the auxiliary power electrode APE exposed by the contact portion CA.

The undercut structure OC_P, PAS_P, and CP may be disposed on a part of the auxiliary power electrode APE and may include an undercut area UC. The undercut structure OC_P, PAS_P, and CP may be formed in an island pattern on a part of the auxiliary power electrode APE, and the auxiliary power electrode APE may be exposed around the undercut structure OC_P, PAS_P, and CP. The auxiliary power electrode APE exposed around the undercut structure OC_P, PAS_P, and CP by the contact portion CA may be electrically connected to the common electrode COM (cathode or second electrode). The undercut structure OC_P, PAS_P, and CP may be made of the same material as the passivation layer PAS, the overcoat layer OC, and the connection electrode CE. The undercut structure OC_P, PAS_P, and CP may include a first pattern OC_P (or eaves structure portion) made of the same material as the overcoat layer OC, a second pattern PAS_P (or pillar structure portion) made of the same material as the passivation layer PAS, and a cover metal pattern CP made of the same material as the connection electrode CE and/or the pad electrode PAD, a description of which will follow.

The light emitting layer EL may be disposed on the pixel electrode PXL and the bank layer BA. The light emitting layer EL may be disposed on the overcoat layer OC. The light emitting layer EL may be disposed on the auxiliary power electrode APE exposed through the contact portion CA. In some aspects, a light emitting layer pattern EL_P may be disposed on the cover metal pattern CP of the undercut structure OC_P, PAS_P, and CP. The light emitting layer pattern EL_P may be made of the same material as the light emitting layer EL during the same process. The light emitting layer pattern EL_P may be formed in the undercut area UC of the undercut structure OC_P, PAS_P, and CP to be disconnected from the light emitting layer EL. For example, the light emitting layer EL may be made of a material that has poor step coverage. Consequently, the area of the light emitting layer EL disposed on the auxiliary power electrode APE may be minimized by the undercut structure OC_P, PAS_P, and CP, and may be disconnected from the light emitting layer pattern EL_P in the undercut area UC of the undercut structure OC_P, PAS_P, and CP, whereby the auxiliary power electrode APE disposed thereunder may be exposed.

The common electrode COM (cathode or second electrode) may be disposed on the light emitting layer EL. The common electrode COM may be disposed on the pixel electrode PXL and the light emitting layer EL to constitute the light emitting element ED. The common electrode COM may be formed widely over the entire surface of the first substrate SUB1. Meanwhile, a common electrode pattern COM_P may be disposed on the light emitting layer pattern EL_P located on the undercut structure OC_P, PAS_P, and CP. The common electrode pattern COM_P may be made of the same material as the common electrode COM during the same process. The common electrode pattern COM_P may be formed to be disconnected from the common electrode COM in the undercut area UC of the undercut structure OC_P, PAS_P, and CP. However, the present disclosure is not limited thereto, and the common electrode pattern COM_P and the common electrode COM may be connected to each other.

The common electrode COM may be made of a transparent conductive material, such as indium tin oxide (ITO) or indium zinc oxide (IZO), or may be made of silver (Ag), aluminum (Al), magnesium (Mg), calcium (Ca), or an alloy thereof, which has a small thickness sufficient to transmit light.

The common electrode COM may be electrically connected to the auxiliary power electrode APE exposed by the contact portion CA. The common electrode COM may be disposed to cover the bank layer BA, and may be disposed on the auxiliary power electrode APE in the undercut area UC of the undercut structure OC_P, PAS_P, and CP. For example, the common electrode COM may be made of a material that exhibits excellent step coverage. The common electrode COM may have better step coverage than the light emitting layer EL, which is formed by deposition, and may extend to an upper part of the auxiliary power electrode APE exposed to the outside as the result of disconnection of the light emitting layer EL in the undercut area UC of the undercut structure OC_P, PAS_P, and CP. Consequently, the light emitting layer EL does not contact the auxiliary power electrode APE in the undercut area UC of the undercut structure OC_P, PAS_P, and CP, and the auxiliary power electrode APE is exposed. However, the common electrode COM may not be covered by the light emitting layer EL, may be disposed at an upper surface of the exposed auxiliary power electrode APE, and may directly contact the auxiliary power electrode APE, whereby the common electrode COM may be electrically connected to the auxiliary power electrode APE.

The encapsulation layer EPAS is configured to protect the light emitting element ED, which may be disposed on the common electrode COM. The encapsulation layer EPAS may completely cover the common electrode COM and prevents introduction of external moisture or oxygen into the light emitting element ED. In some aspects, an encapsulation layer pattern EPAS_P may be disposed on the common electrode pattern COM_P located on the undercut structure OC_P, PAS_P, and CP. The encapsulation layer pattern EPAS_P may be made of the same material as the encapsulation layer EPAS during the same process. The encapsulation layer pattern EPAS_P may be formed to be disconnected from the encapsulation layer EPAS in the undercut area UC of the undercut structure OC_P, PAS_P, and CP. However, the present disclosure is not limited thereto, and the encapsulation layer pattern EPAS_P and the encapsulation layer EPAS may be connected.

Meanwhile, a capping layer is configured to cover the common electrode COM and may be disposed between the encapsulation layer EPAS and the common electrode COM. In this case, the encapsulation layer EPAS may directly cover the capping layer. The encapsulation layer EPAS may be a thin film encapsulation layer.

In an aspect, the encapsulation layer EPAS may be a single inorganic layer. For example, the encapsulation layer EPAS may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride. In another aspect, the encapsulation layer EPAS may be formed in a multilayer structure including an inorganic layer, an organic layer, and an inorganic layer. In this case, the inorganic layer may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride, as described above, and the organic layer may be made of an acrylic-based rein, a methacrylic-based resin, polyisoprene, a vinyl-based resin, an epoxy-based resin, a urethane-based resin, a cellulose-based resin, or a perylene-based resin.

However, the structure of the encapsulation layer EPAS is not limited to the above examples, and the encapsulation layer EPAS may have various stack structures.

The filler FILL may be disposed on the encapsulation layer EPAS. The filler FILL may cover the encapsulation layer EPAS to prevent the introduction of external moisture or oxygen into the light emitting element ED. The filler FILL may be made of a material that transmits light. For example, the filler FILL may be made of an organic material. Non-limiting examples of the filler FILL may include a silicon-based organic material, an epoxy-based organic material, or a mixture of the silicon-based organic material and the epoxy-based organic material.

The second substrate SUB2 may be disposed on the filler FILL. The second substrate SUB2 may prevent introduction of external moisture or oxygen into the light emitting element ED, in the same manner as the filler FILL. The second substrate SUB2 may be made of a material that transmits light. For example, the second substrate SUB2 may include a glass substrate or a plastic substrate. In addition, the second substrate SUB2 may further include a separate layer located on the glass substrate or the plastic substrate, such as a dielectric layer made of an inorganic film.

The dam DAM may be located in the non-active area NA adjacent to the active area AA. The dam DAM may be disposed between the first substrate SUB1 and the second substrate SUB2 to prevent outflow of the filler FILL to the outside. The dam DAM may be made of an organic material. For example, the dam DAM may be made of an epoxy-based resin, however, the present disclosure is not limited thereto.

The pad electrode PAD may be disposed in the non-active area NA adjacent to the end of the display panel 110. The pad electrode PAD may be electrically connected to the data driving unit 140 formed on the passivation layer PAS to supply a data signal to the subpixels SP1, SP2, SP3, and SP4. The pad electrode PAD may be connected to a second line L2 formed on the same layer as the auxiliary power line EVSS through a first line L1 formed on the same layer as the auxiliary power electrode APE. The first and second lines L1 and L2 may be configured to transmit the data signal from the data driving unit 140 to the subpixels SP1, SP2, SP3, and SP4. However, the present disclosure is not limited thereto, and the pad electrode PAD may be an electrode configured to transmit a power signal or a reference signal to the subpixels SP1, SP2, SP3, and SP4.

The pad electrode PAD may be made of the same material as the connection electrode CE and/or the cover metal pattern CP. For example, the pad electrode PAD may be made of a molybdenum titanium alloy (MoTi) or indium tin oxide (ITO). Even though exposed to the outside, therefore, the pad electrode PAD may be hardly oxidized.

Figure 4A:
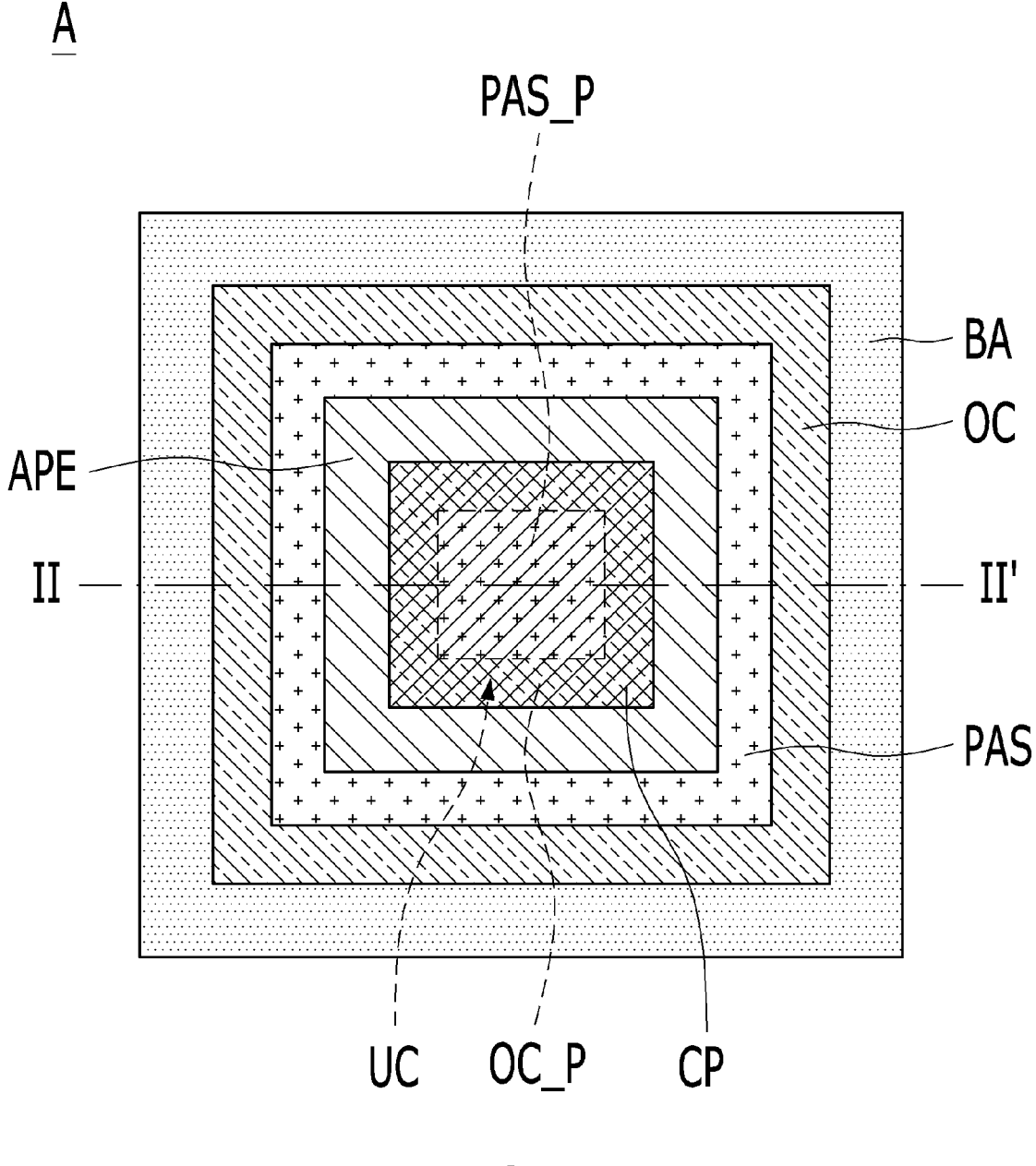
FIG. 4A is a plan view showing a contact area indicated by part A of FIG. 3 according to an aspect of the present disclosure.
Figure 4B:
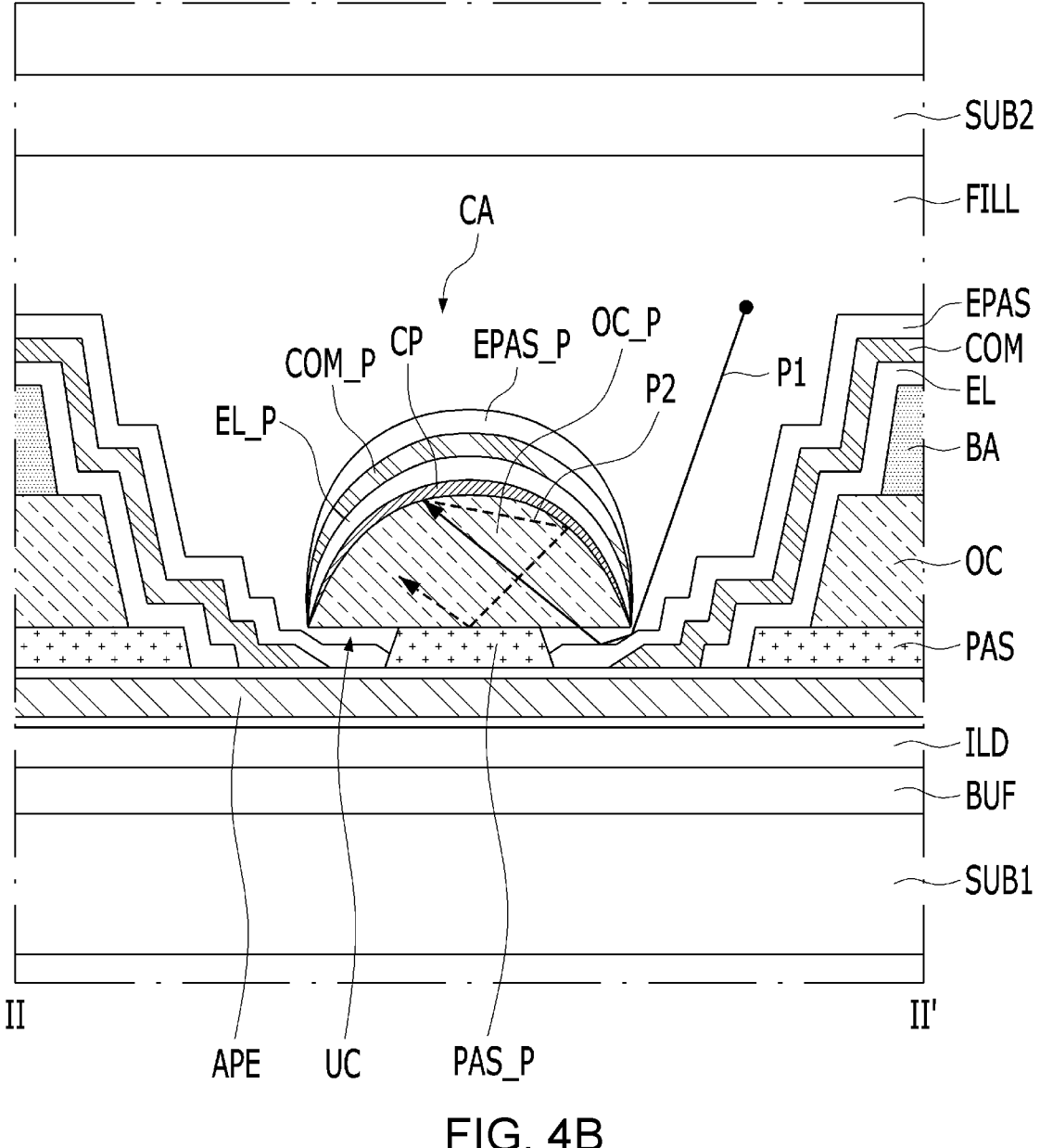
FIG. 4B is a cross-sectional view taken along line II-II' of FIG. 4A.

FIG. 4A is a plan view showing a contact area indicated by part A of FIG. 3 according to an aspect of the present disclosure, and FIG. 4B is a cross-sectional view taken along line II-II' of FIG. 4A.

Referring to FIGS. 3, 4A, and 4B, the contact area of the light emitting display device 100 according to the aspect of the present disclosure may include a contact portion CA configured to expose a part of the auxiliary power electrode APE. The contact portion CA may expose a part of the auxiliary power electrode APE through the passivation layer PAS (or second protection layer), the overcoat layer OC (or first protection layer), and the bank layer BA. An undercut structure OC_P, PAS_P, and CP including a first pattern OC_P (or eaves structure portion), a second pattern PAS_P (or pillar structure portion), and a cover metal pattern CP may be disposed on the auxiliary power electrode APE exposed by the contact portion CA.

The undercut structure OC_P, PAS_P, and CP may be disposed on a part of the auxiliary power electrode APE and may include an undercut area UC. The undercut structure OC_P, PAS_P, and CP may be formed in an island pattern on a part of the auxiliary power electrode APE, and an area in which the auxiliary power electrode APE is exposed may be formed around the undercut structure OC_P, PAS_P, and CP. The auxiliary power electrode APE exposed around the undercut structure OC_P, PAS_P, and CP by the contact portion CA may be electrically connected to the common electrode COM (cathode or second electrode). The undercut structure OC_P, PAS_P, and CP may include a first pattern OC_P (or eaves structure portion) made of the same material as the overcoat layer OC, a second pattern PAS_P (or pillar structure portion) made of the same material as the passivation layer PAS, and a cover metal pattern CP made of the same material as the connection electrode CE and/or the pad electrode PAD.

The first pattern OC_P of the undercut structure OC_P, PAS_P, and CP may be made of an organic insulating material, and the second pattern PAS_P may be made of an inorganic insulating material. In addition, the cover metal pattern CP may be made of a metal that exhibits high oxidation resistance. The first pattern OC_P may be made of the same material as the overcoat layer OC. The first pattern OC_P and the overcoat layer OC may be simultaneously formed through the same process. The second pattern PAS_P may be made of the same material as the passivation layer PAS on the same layer. The second pattern PAS_P and the passivation layer PAS may be simultaneously formed through the same process. The cover metal pattern CP may be made of the same material as the connection electrode CE and/or the pad electrode PAD. For example, the cover metal pattern CP may be made of a molybdenum titanium alloy (MoTi) or indium tin oxide (ITO). The cover metal pattern CP and the connection electrode CE and/or the pad electrode PAD may be simultaneously formed through the same process. However, the present disclosure is not limited thereto.

The first pattern OC_P may be disposed on a part of the auxiliary power electrode APE. The first pattern OC_P may be formed on the auxiliary power electrode APE in an island pattern, and the undercut area UC may be formed under the edge of the first pattern OC_P. The first pattern OC_P may be disposed on the second pattern PAS_P and may overlap a part of the exposed auxiliary power electrode APE.

The second pattern PAS_P may be formed on the upper surface of the auxiliary power electrode APE to overlap the first pattern OC_P to support the first pattern OC_P. The second pattern PAS_P may be formed on the auxiliary power electrode APE in an island pattern. The second pattern PAS_P may include an upper surface having a first width and abutting the first pattern OC_P, a lower surface having a second width greater than the first width and abutting the auxiliary power electrode APE, and an inclined surface provided between the upper surface and the lower surface. The width of a lower surface of the first pattern OC_P may be greater than the first width of the upper surface of the second pattern PAS_P. In addition, the width of the first pattern OC_P may be equal to or greater than the second width of the lower surface of the second pattern PAS_P. Since the lower surface of the first pattern OC_P has a larger width than at least the upper surface of the second pattern PAS_P, the undercut area UC may be formed under the edge of the first pattern OC_P.

The cover metal pattern CP may cover the entirety of the upper surface of the first pattern OC_P. The thickness of the cover metal pattern CP may be gradually decreased from the center to the edge of the first pattern OC_P. Consequently, the width of the cover metal pattern CP may be substantially equal to the width of the first pattern OC_P. In addition, the cover metal pattern CP may completely overlap the first pattern OC_P. In addition, the cover metal pattern CP may have the same planar shape as the first pattern OC_P.

The second pattern PAS_P may be formed as the result of the passivation layer PAS overlapping the first pattern OC_P being etched such that a part of the auxiliary power electrode APE is exposed around the first pattern OC_P. The second pattern PAS_P may be overetched in an area thereof overlapping the edge of the first pattern OC_P to be depressed further inside than the edge of the first pattern OC_P, whereby the undercut area UC may be formed.

In the undercut structure OC_P, PAS_P, and CP according to the aspect of the present disclosure, as shown in FIGS. 4A and 4B, the undercut area UC may be formed under the edge of the first pattern OC_P and the cover metal pattern CP. The undercut area UC may be formed as the result of the second pattern PAS_P corresponding to the edge of the first pattern OC_P and the cover metal pattern CP being patterned to be depressed further inside than the edge of the first pattern OC_P and the cover metal pattern CP. The undercut area UC may include a lower surface of the edge of the first pattern OC_P and the cover metal pattern CP and a side surface of the second pattern PAS_P.

The light emitting layer EL may be partially formed on the exposed area of the auxiliary power electrode APE along the step of the passivation layer PAS, the overcoat layer OC, and the bank layer BA around the undercut structure OC_P, PAS_P, and CP. In addition, the light emitting layer pattern EL_P may be formed on the undercut structure OC_P, PAS_P, and CP, and may be disconnected from the light emitting layer EL. The light emitting layer EL may not be disposed on the auxiliary power electrode APE corresponding to the undercut area UC in the exposed area of the auxiliary power electrode APE. Since the light emitting layer EL is made of a material that has poor step coverage, the light emitting layer EL does not extend to the auxiliary power electrode APE in the undercut area UC and is disconnected from the auxiliary power electrode APE, whereby the area of the light emitting layer EL disposed on the exposed area of the auxiliary power electrode APE may be minimized.

The common electrode COM may be formed on the light emitting layer EL. The common electrode COM may be formed on the light emitting layer EL along the step of the passivation layer PAS, the overcoat layer OC, and the bank layer BA around the undercut structure OC_P, PAS_P, and CP. In addition, the common electrode pattern COM_P may be formed on the light emitting layer pattern EL_P, and may be disconnected from the common electrode COM. However, the present disclosure is not limited thereto, and the common electrode pattern COM_P and the common electrode COM may be connected to each other. The common electrode COM may be disposed at the upper surface of the auxiliary power electrode APE that is not covered by the light emitting layer EL but is exposed, and may directly contact the auxiliary power electrode APE, whereby the common electrode COM may be electrically connected to the auxiliary power electrode APE. Since the common electrode COM is made of a material that has better step coverage than the light emitting layer EL, the common electrode COM extends to the auxiliary power electrode APE in the undercut area UC in which the light emitting layer EL is not formed, whereby the common electrode COM may directly contact the auxiliary power electrode APE, and therefore the common electrode COM may be electrically connected to the auxiliary power electrode APE. In the light emitting display device 100 according to the aspect of the present disclosure, the light emitting layer EL does not cover the auxiliary power electrode APE overlapping the undercut area UC and the common electrode COM directly contacts and is electrically connected to the auxiliary power electrode APE that is not covered by the light emitting layer EL. In some aspects, the common electrode COM contacting the auxiliary power electrode APE may reduce nonuniformity in voltage drop depending on resistance deviation of the common electrode COM in the entirety of the display panel.

The encapsulation layer EPAS is configured to protect the light emitting element ED and may be disposed on the common electrode COM. The encapsulation layer EPAS may completely cover the common electrode COM and prevent introduction of external moisture or oxygen into the light emitting element ED. Meanwhile, an encapsulation layer pattern EPAS_P may be disposed on the common electrode pattern COM_P located on the undercut structure OC_P, PAS_P, and CP. The encapsulation layer pattern EPAS_P may be made of the same material as the encapsulation layer EPAS during the same process. The encapsulation layer pattern EPAS_P may be formed to be disconnected from the encapsulation layer EPAS in the undercut area UC of the undercut structure OC_P, PAS_P, and CP. However, the present disclosure is not limited thereto, and the encapsulation layer pattern EPAS_P and the encapsulation layer EPAS may be connected to each other.

As previously described, the filler FILL and the second substrate SUB2 may be disposed on the encapsulation layer EPAS.

Meanwhile, in the light emitting display device 100 according to the aspect of the present disclosure, the overcoat layer OC may be formed as the result of a part of the passivation layer PAS around the contact portion CA being patterned to be exposed. In addition, the bank layer BA may also be formed as the result of a part of the overcoat layer OC around the contact portion CA being patterned to be exposed. Since a gentle step is formed at the passivation layer PAS, the overcoat layer OC, and the bank layer BA around the contact portion CA, as described above, the common electrode COM may stably contact the auxiliary power electrode APE.

FIGS. 5A to 5E are sectional views showing a method of manufacturing an undercut structure according to an aspect of the present disclosure.

Figure 5A:
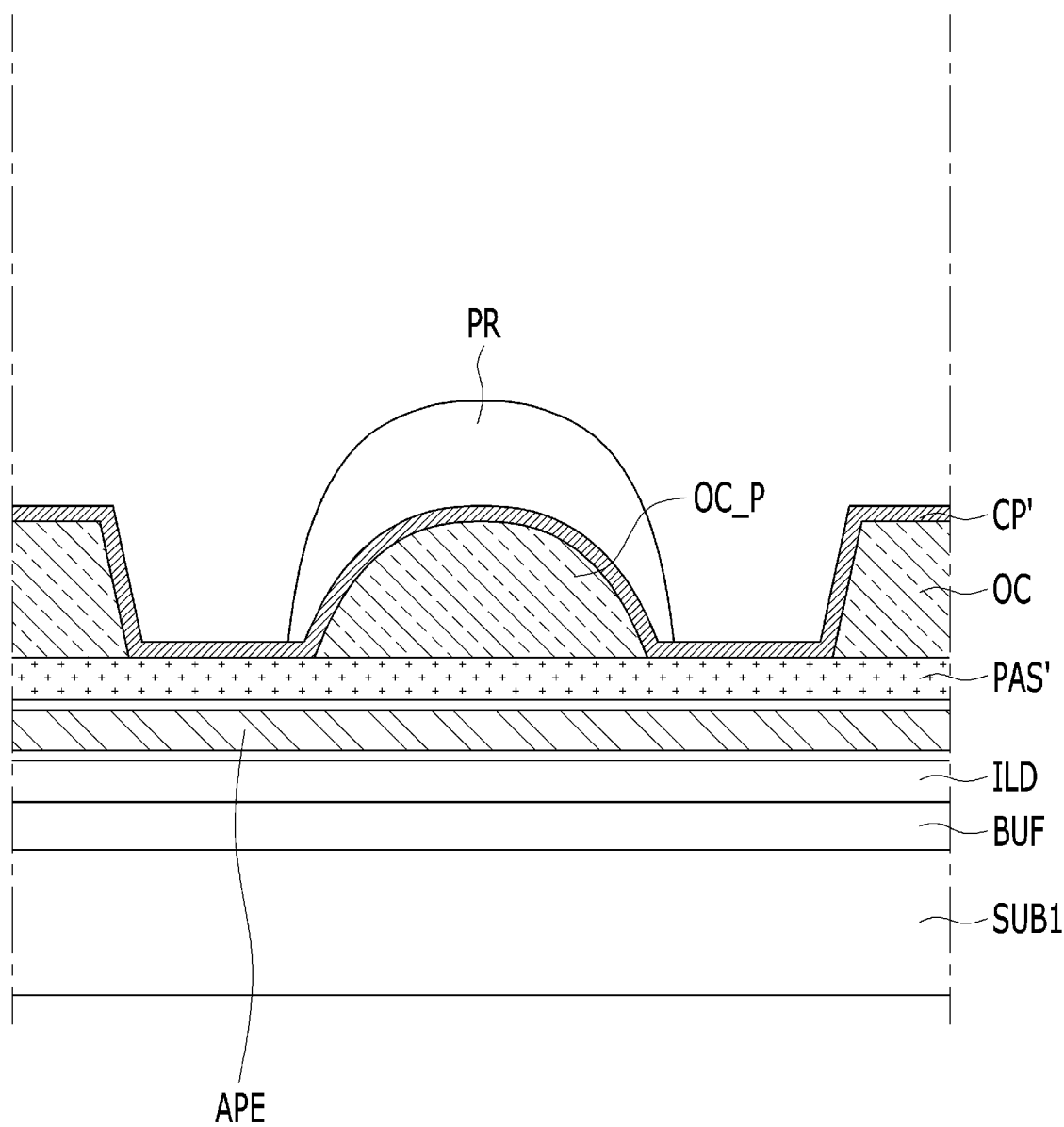
FIGS. 5A to 5E are cross-sectional views showing a method of manufacturing an undercut structure according to an aspect of the present disclosure.

First, referring to FIG. 5A, a buffer layer BUF, an interlayer dielectric film ILD, and an auxiliary power electrode APE are sequentially formed on a first substrate SUB1. Subsequently, a passivation material layer PAS' is formed on the interlayer dielectric film ILD having the auxiliary power electrode APE formed thereon. Subsequently, an overcoat layer OC and a first pattern OC_P are formed on the passivation material layer PAS'. Subsequently, a cover metal material layer CP' is formed on the passivation material layer PAS', the overcoat layer OC, and the first pattern OC_P. Subsequently, a photoresist pattern PR having a larger width than the first pattern OC_P is formed. The photoresist pattern PR completely covers the first pattern OC_P but does not overlap the overcoat layer OC.

Figure 5B:
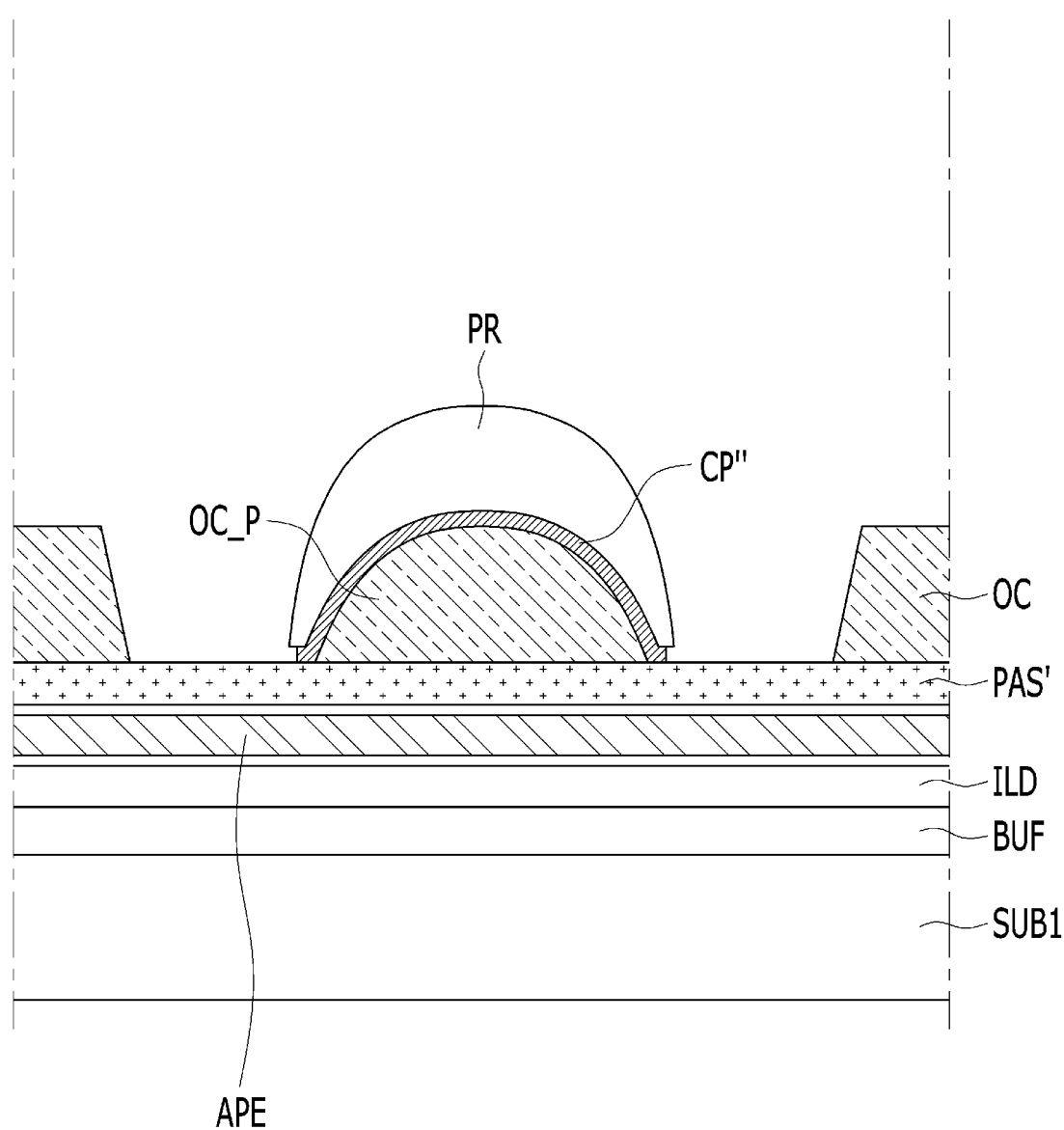

Next, referring to FIG. 5B, the cover metal material layer CP' is patterned. Specifically, the cover metal material layer CP' is etched using the photoresist pattern PR as a mask to form a cover metal intermediate pattern CP''. At this time, the cover metal material layer CP' may be overetched such that the width of the cover metal intermediate pattern CP'' is less than the width of the photoresist pattern PR.

Figure 5C:
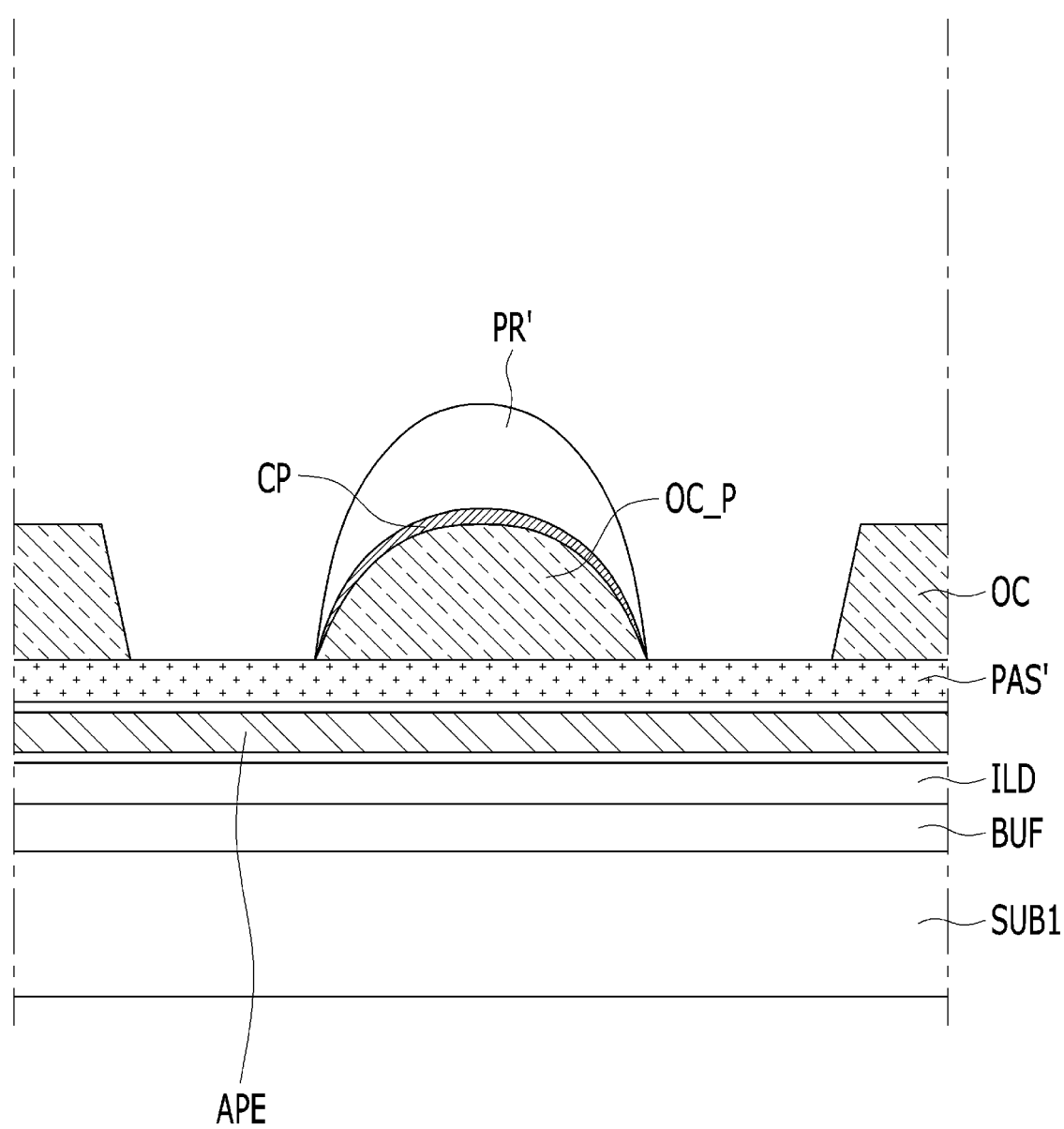

Next, referring to FIG. 5C, an ashing process is performed to form a cover metal pattern CP. When the ashing process is performed, the width of the photoresist pattern PR is reduced, whereby a photoresist ashing pattern PR' is formed. Correspondingly, the width of the cover metal intermediate pattern CP'' is also reduced, whereby the cover metal pattern CP is formed. In this case, the widths of the first pattern OC_P, the cover metal pattern CP, and the photoresist ashing pattern PR' may be substantially equal to each other.

Figure 5D:
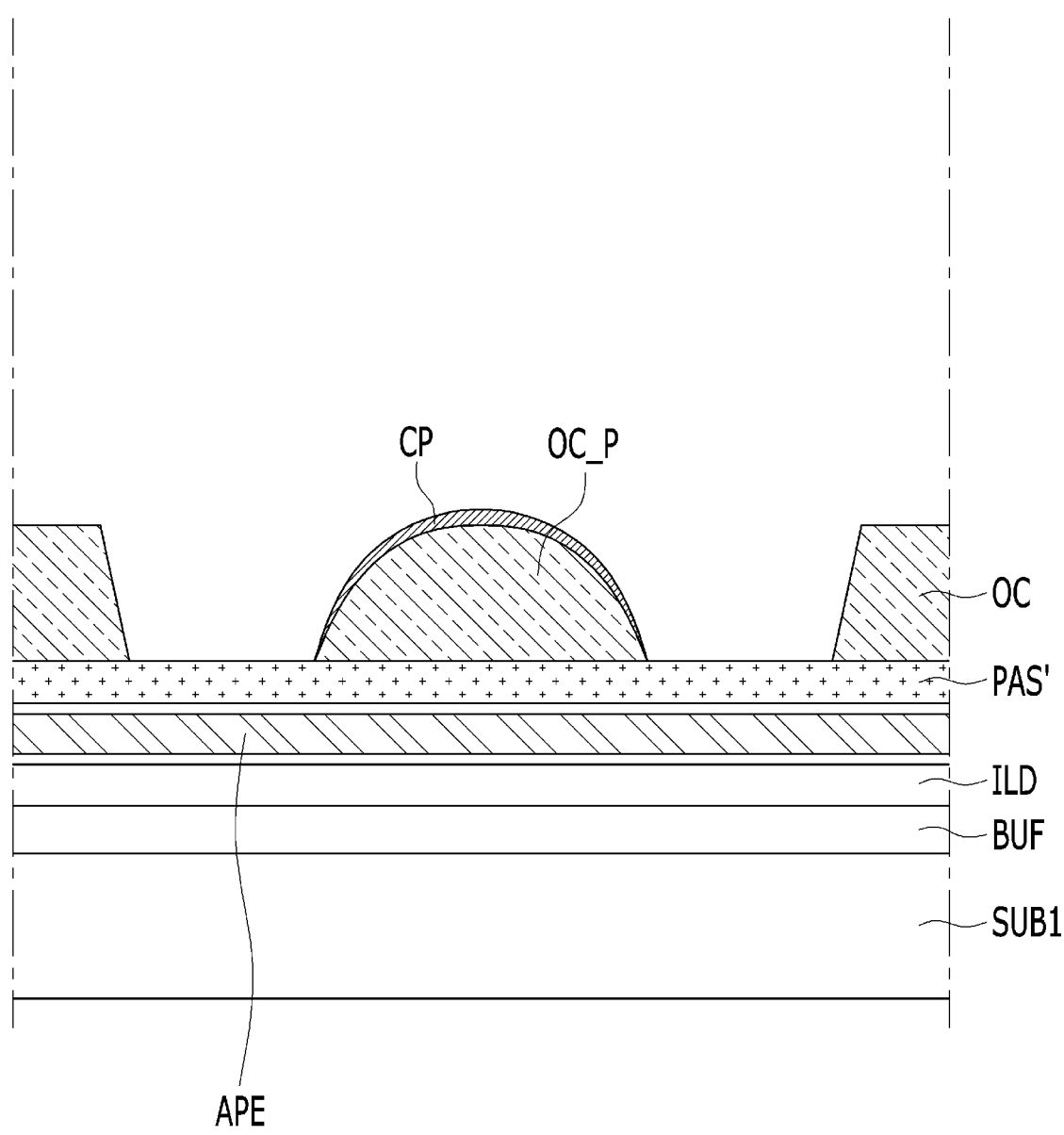

Next, referring to FIG. 5D, the photoresist ashing pattern PR' is removed by stripping.

Figure 5E:
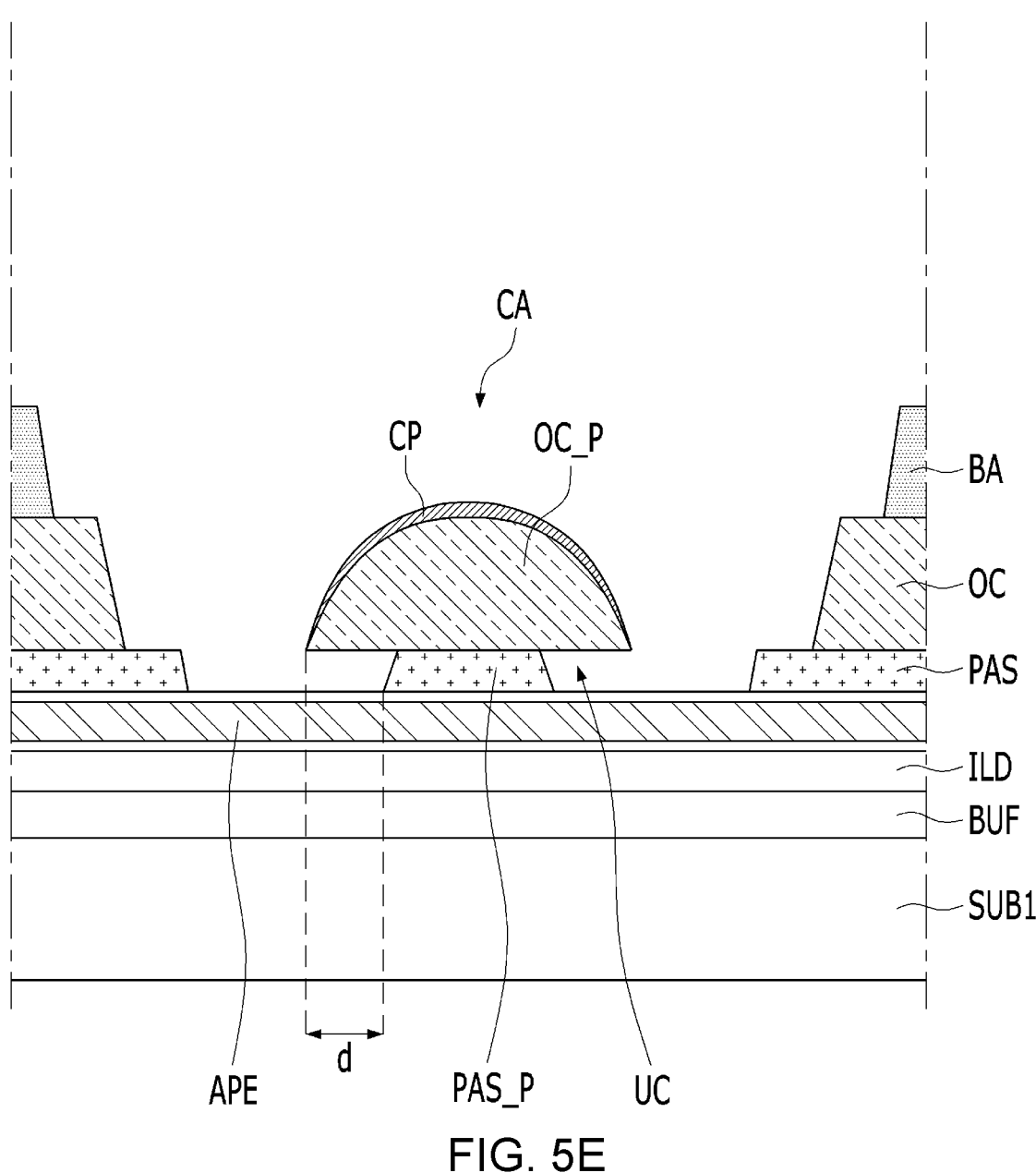

Next, referring to FIG. 5E, a bank layer BA is formed, and then the passivation material layer PAS' under the cover metal pattern CP is removed to form a passivation layer PAS and a second pattern PAS_P. As a result, an undercut structure OC_P, PAS_P, and CP including a first pattern OC_P, a second pattern PAS_P, and a cover metal pattern CP may be formed. Subsequently, as shown in FIG. 4B, a light emitting layer EL and a light emitting layer pattern EL_P may be simultaneously formed through the same process. Subsequently, a common electrode COM and a common electrode pattern COM_P may be simultaneously formed through the same process. Subsequently, an encapsulation layer EPAS and an encapsulation layer pattern EPAS_P may be simultaneously formed through the same process.

Figure 6:
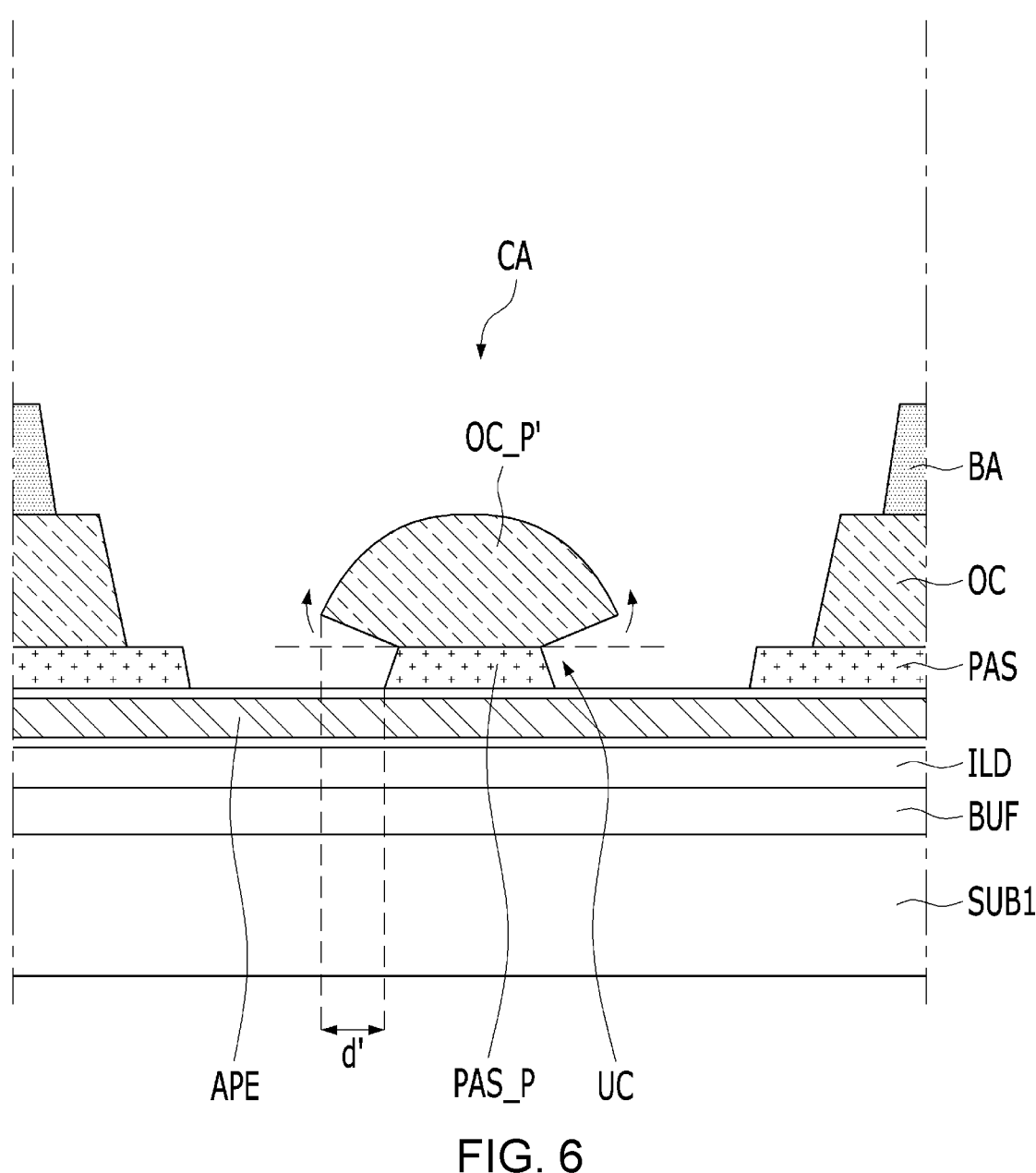
FIG. 6 is a cross-sectional view of an undercut structure according to a comparative example.

FIG. 6 is a sectional view of an undercut structure according to a comparative example. An effect of the aspect of the present disclosure will be described with reference to FIGS. 6 and 5E.

First, referring to FIG. 6, loosening of the edge of a first comparison pattern OC_P', which is not covered with a cover metal pattern, occurs. Here, the first comparison pattern OC_P' is a pattern that is made of the same material as the first pattern during the same process but is not covered with the cover metal pattern. The first comparison pattern OC_P' occurs may loosen at the edges because thermal stability of an organic material constituting the first comparison pattern OC_P' is low and may shrink. Specifically, as a passivation material layer PAS that strongly holds a lower surface of the edge of the first comparison pattern OC_P' is removed, the edge of the first comparison pattern OC_P' is in an easily movable state. Subsequently, when a curing process is performed, the first comparison pattern OC_P' shrinks, whereby a loosening phenomenon occurs. As a result, the distance d' between a side end of the first comparison pattern OC_P' and a lower end of a second pattern PAS_P, which is the width of an undercut area, becomes less than the distance d between a side end of the first pattern OC_P' and a lower end of the second pattern PAS_P, which is the width of the undercut area of FIG. 5E. That is, since the undercut area is relatively reduced without the cover metal pattern, patterning time and etching area are increased to form a desired undercut area.

In contrast, referring to FIG. 5E, since the cover metal pattern CP covers the edge of the first pattern OC_P, mobility of the edge may be reduced. That is, even though the passivation material layer PAS, which strongly holds the lower surface of the edge of the first pattern OC_P, is removed, the cover metal pattern CP strongly support an upper surface of the edge of the first pattern OC_P, whereby loosening of the first pattern OC_P does not occur. Consequently, it is possible to reduce patterning time and etching area necessary to form the undercut area.

In addition, since the width of the first pattern OC_P and the width of the cover metal pattern CP are substantially equal to each other, it is possible to reduce the size of the undercut structure OC_P, PAS_P, and CP, and therefore it is possible to improve the light emission aperture ratio of the display panel 110.

Another effect of the aspect of the present disclosure will be described with reference back to FIG. 4B.

Gas may be discharged from the organic material included in the filler FILL configured to protect the light emitting element from external moisture or oxygen. If the gas permeates the light emitting element ED, efficiency of the light emitting element ED may be reduced or the light emitting element ED may become a dark dot. Consequently, the undercut structure OC_P, PAS_P, and CP is formed in an island pattern, whereby it is possible to prevent permeation of gas from the undercut structure OC_P, PAS_P, and CP into the light emitting element ED.

In addition, gas is captured in the undercut structure OC_P, PAS_P, and CP, whereby it is possible to improve overall reliability of the display panel 110. Specifically, gas discharged from the filler FILL may be introduced into the undercut structure OC_P, PAS_P, and CP along a path P1 indicated by a solid arrow. Here, the lower surface of the edge of the first pattern OC_P may directly contact the filler FILL, whereby the gas may be easily introduced. At this time, if the cover metal pattern CP is not present, the gas introduced into the undercut structure OC_P, PAS_P, and CP is introduced into the filler FILL again. The gas may permeate the light emitting element ED, whereby the light emitting element ED may be damaged. Since the cover metal pattern CP is present, however, the gas introduced into the undercut structure OC_P, PAS_P, and CP flows along a path P2 indicated by a dotted arrow, and may be captured in the first pattern OC_P. Consequently, it is possible to reduce damage to the light emitting element ED due to gas.

Figure 7A:
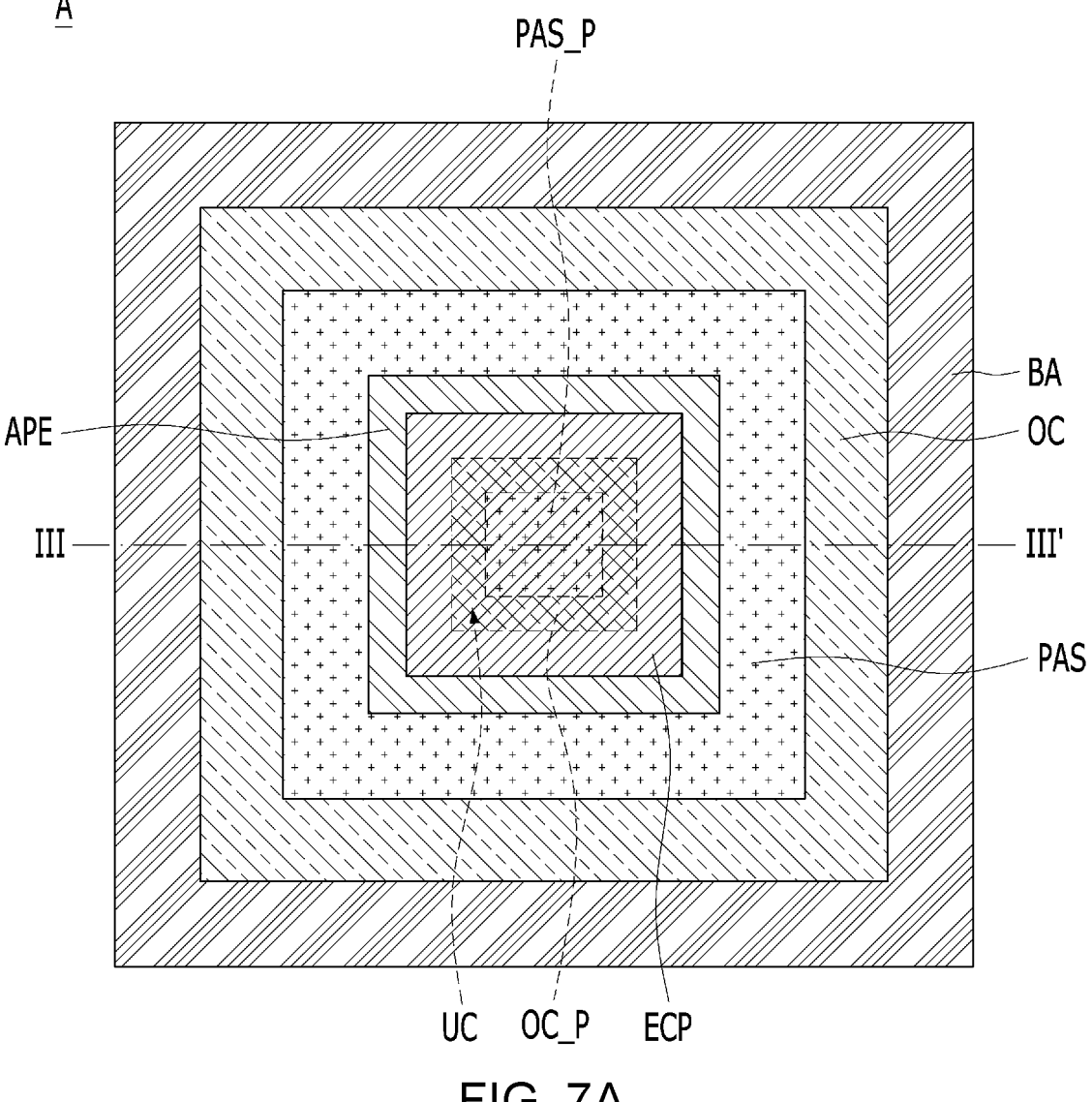
FIG. 7A is a plan view showing a contact area indicated by part A of FIG. 3 according to another aspect of the present disclosure.

Hereinafter, another aspect of the present disclosure will be described. Elements substantially identical to the above elements are denoted by the same reference symbols, and a description thereof will be omitted. FIG. 7A is a plan view showing a contact area indicated by part A of FIG. 3 according to another aspect of the present disclosure, and FIG. 7B is a sectional view taken along line III-III' of FIG. 7A.

Figure 7B:
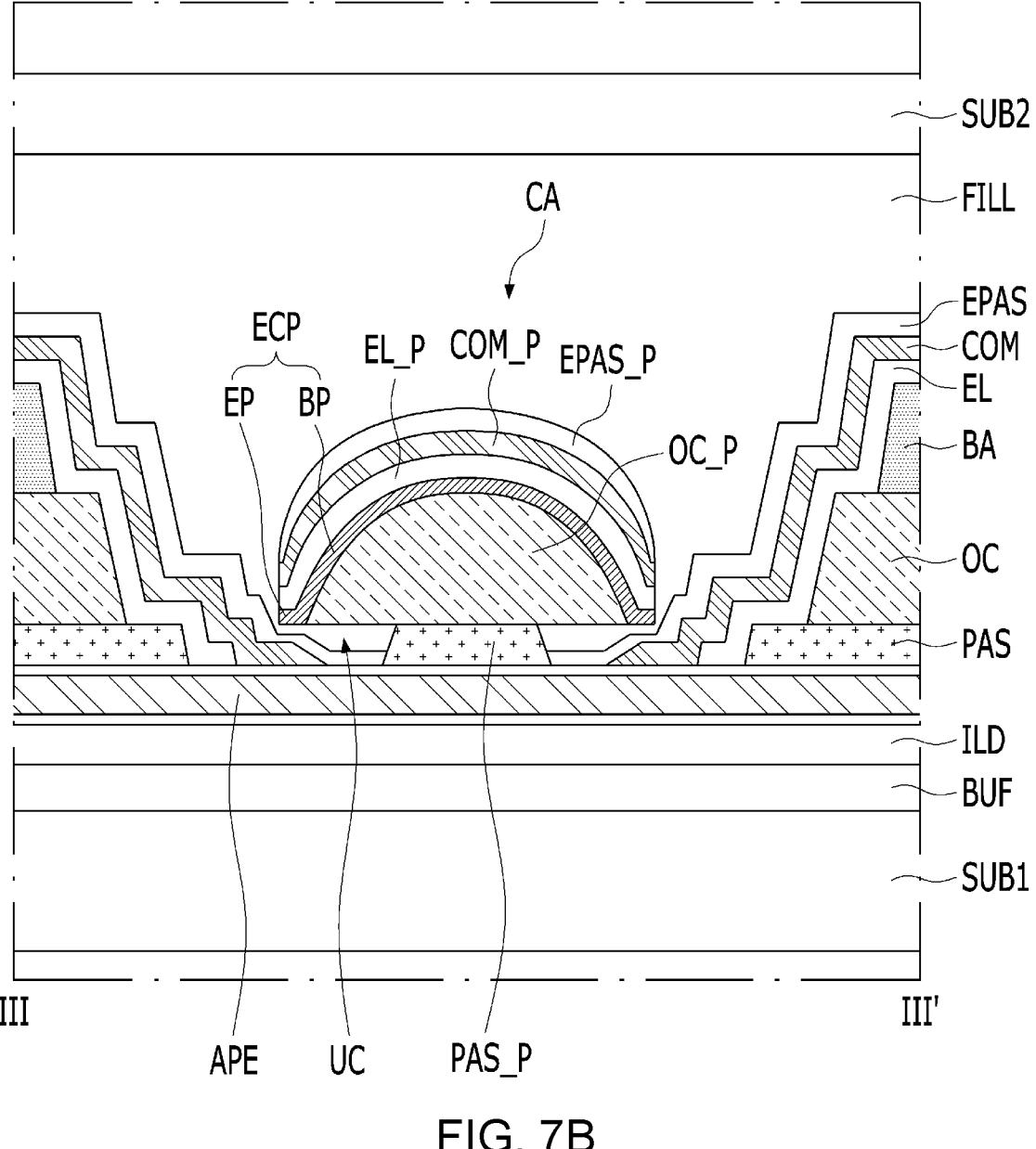
FIG. 7B is a cross-sectional view taken along line III-III' of FIG. 7A.

Referring to FIGS. 7A and 7B, in the other aspect of the present disclosure, an extension cover metal pattern ECP may be included instead of the cover metal pattern CP in the aspect of the present disclosure. That is, an undercut structure OC_P, PAS_P, and ECP may include an extension cover metal pattern ECP. The extension cover metal pattern ECP may include a body portion BP located on a first pattern OC_P and an extension portion EP protruding from a side end of the body portion BP in a direction parallel to the substrate. Here, the thickness of each of the body portion BP and the extension portion EP may be uniform. In addition, the thicknesses of the body portion BP and the extension portion EP may be substantially equal to each other.

Since the undercut structure OC_P, PAS_P, and ECP includes the extension cover metal pattern ECP, as described above, an undercut area may be increased, and an ashing process may be omitted. Consequently, it is possible to more stably achieve cathode contact while reducing expense.

FIGS. 8A to 8D are sectional views showing a method of manufacturing an undercut structure according to another aspect of the present disclosure.

Figure 8A:
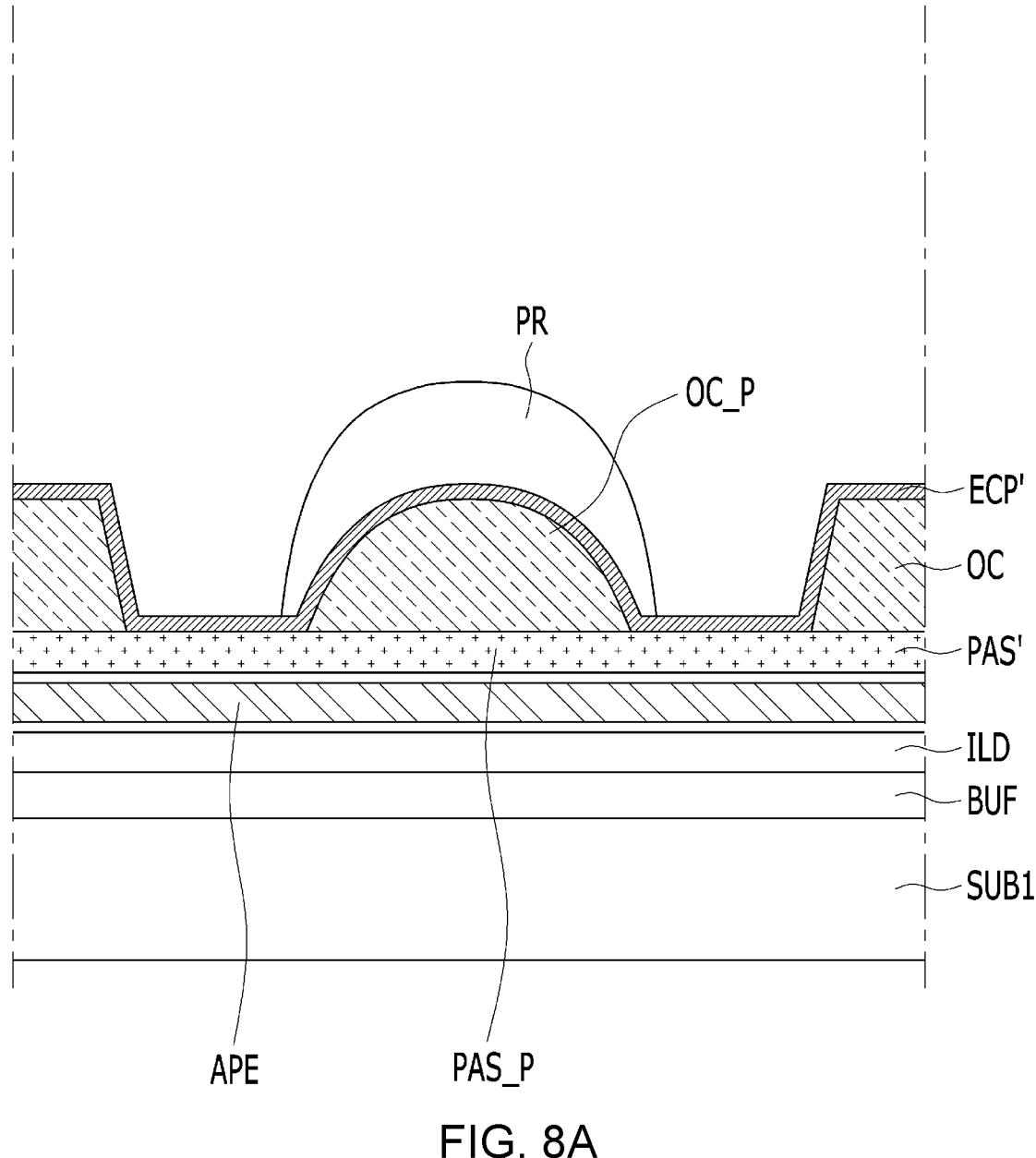
FIGS. 8A to 8D are cross-sectional views showing a method of manufacturing an undercut structure according to another aspect of the present disclosure.

First, referring to FIG. 8A, a buffer layer BUF, an interlayer dielectric film ILD, and an auxiliary power electrode APE are sequentially formed on a first substrate SUB1. Subsequently, a passivation material layer PAS' is formed on the interlayer dielectric film ILD having the auxiliary power electrode APE formed thereon. Subsequently, an overcoat layer OC and a first pattern OC_P are formed on the passivation material layer PAS'. Subsequently, an extension cover metal material layer ECP' is formed on the passivation material layer PAS', the overcoat layer OC, and the first pattern OC_P. Subsequently, a photoresist pattern PR having a larger width than the first pattern OC_P is formed. The photoresist pattern PR completely covers the first pattern OC_P but does not overlap the overcoat layer OC.

Figure 8B:
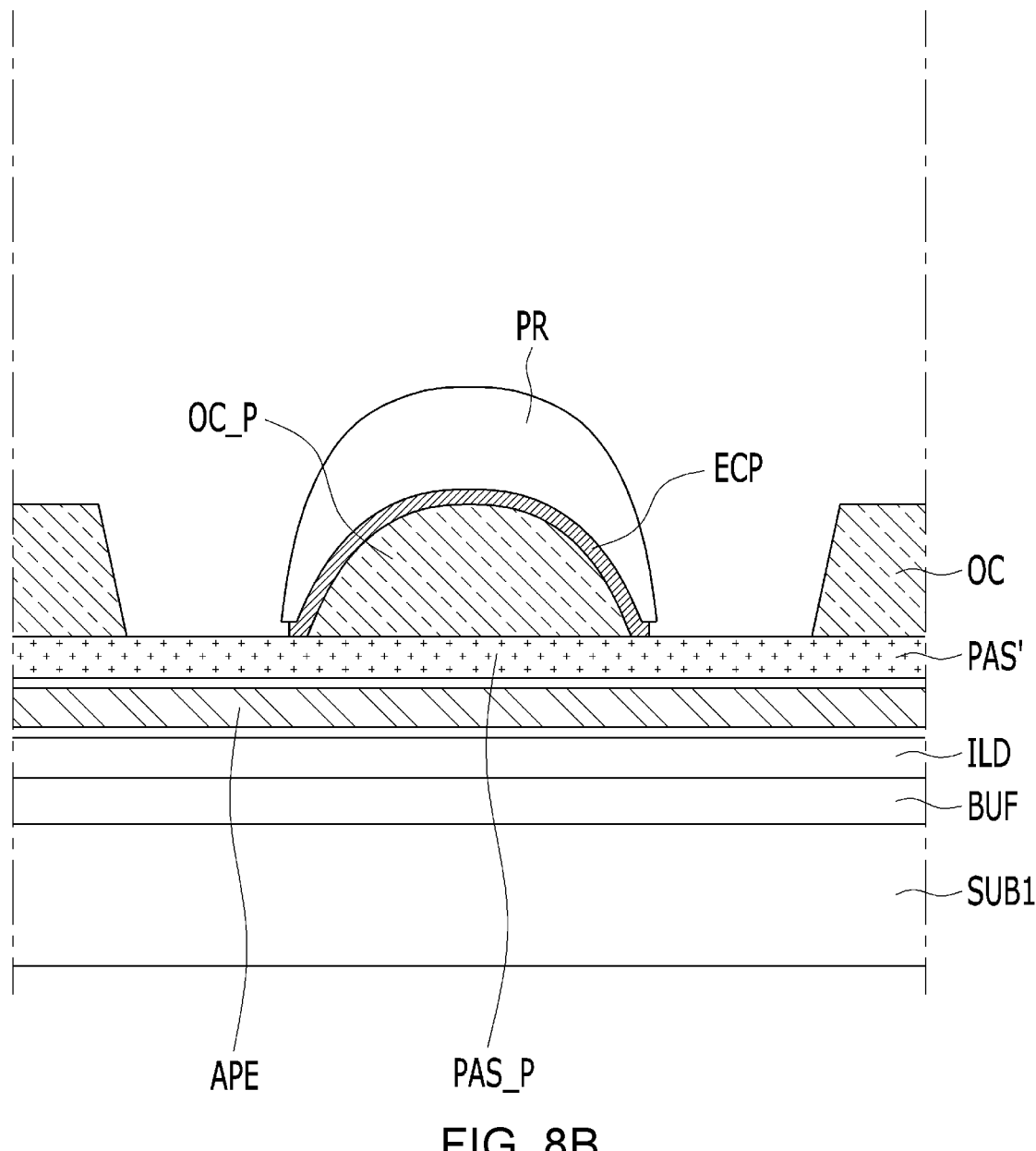

Next, referring to FIG. 8B, the extension cover metal material layer ECP' is patterned. Specifically, the extension cover metal material layer ECP' is etched using the photoresist pattern PR as a mask to form an extension cover metal pattern ECP. At this time, the extension cover metal material layer ECP' may be overetched such that the width of the extension cover metal pattern ECP' is less than the width of the photoresist pattern PR.

Figure 8C:
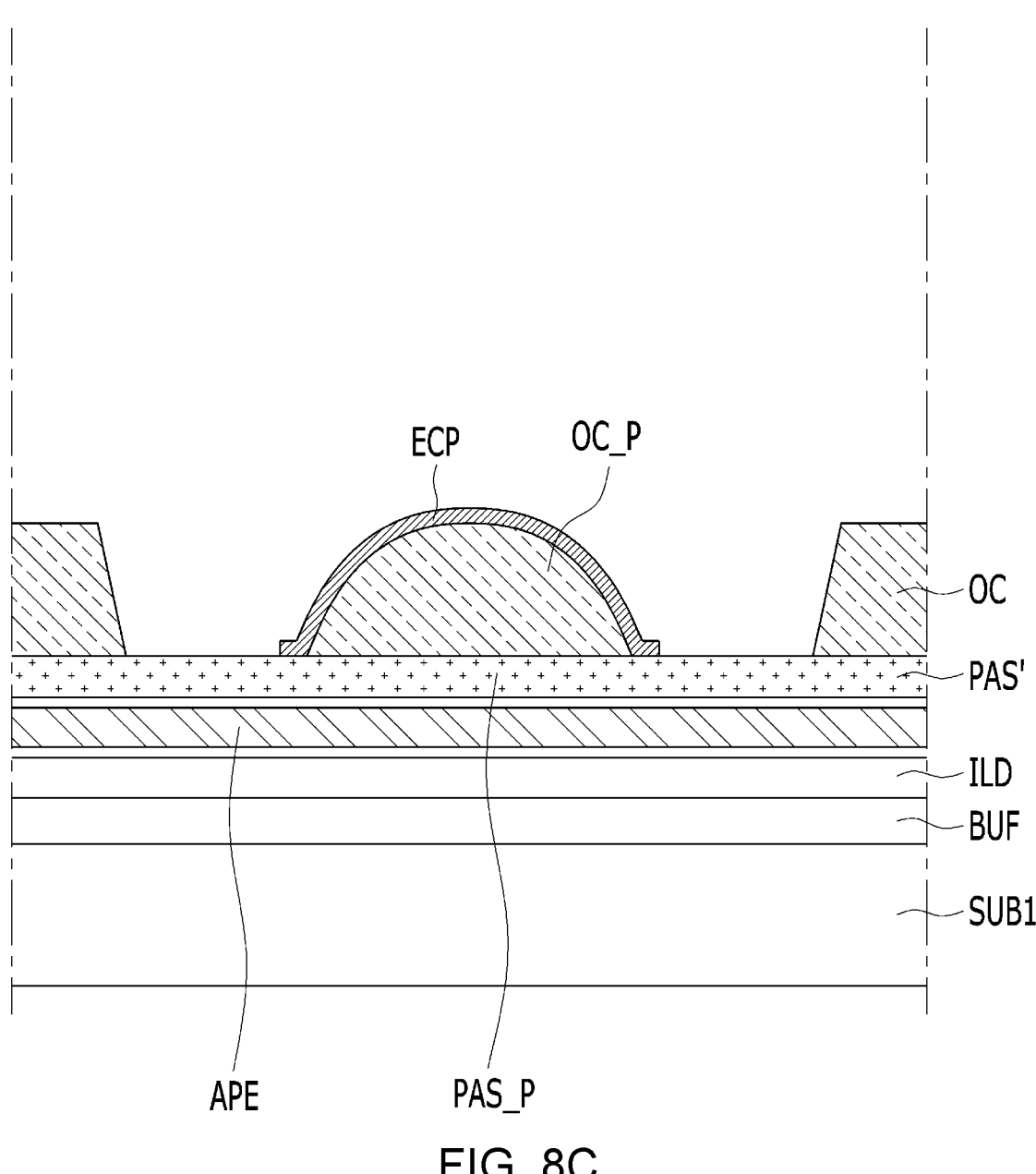

Next, referring to FIG. 8C, the photoresist pattern PR is removed by stripping.

Figure 8D:
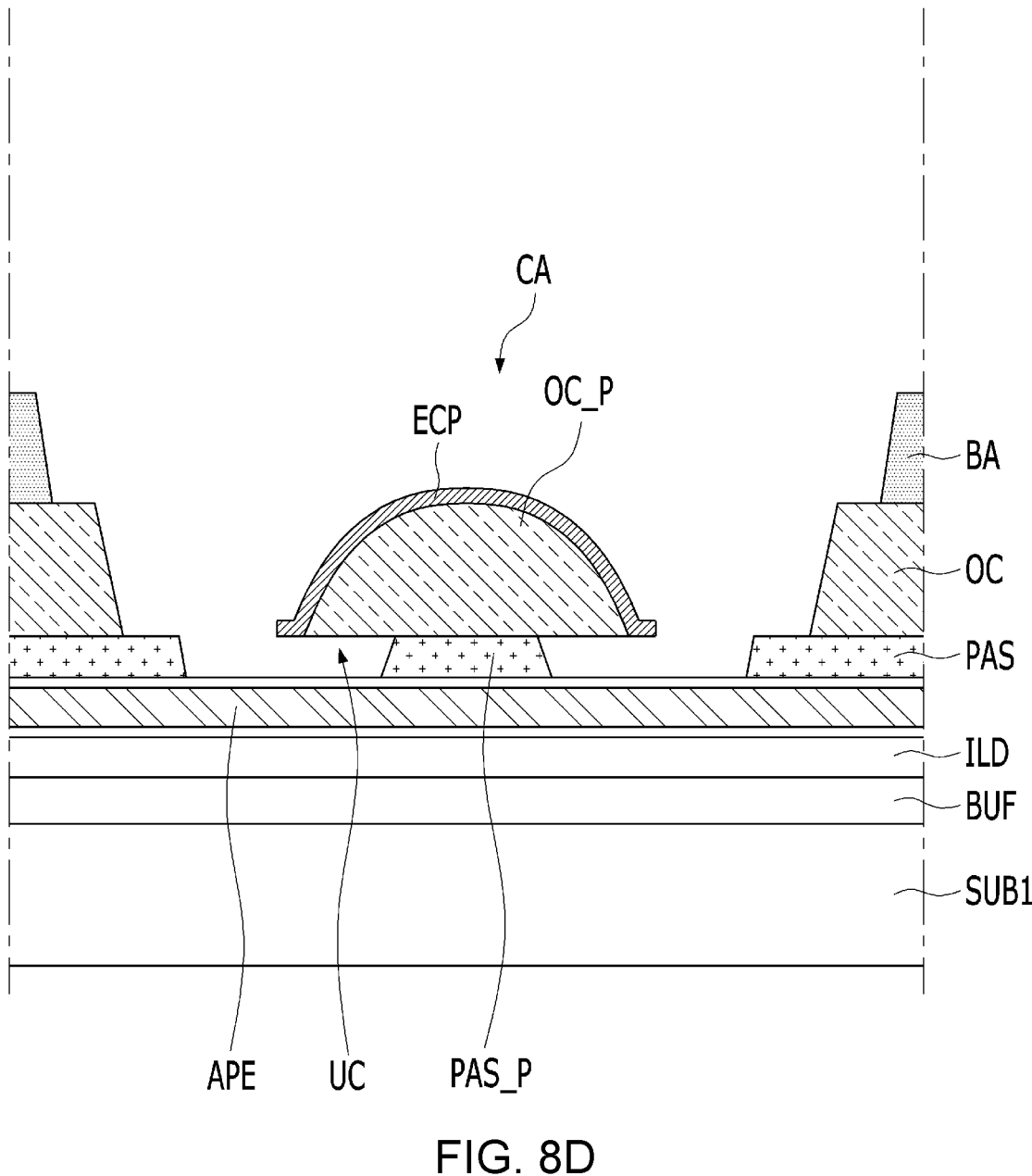

Next, referring to FIG. 8D, a bank layer BA is formed, and then the passivation material layer PAS' under the extension cover metal pattern ECP is removed to form a passivation layer PAS and a second pattern PAS_P. As a result, an undercut structure OC_P, PAS_P, and ECP including a first pattern OC_P, a second pattern PAS_P, and an extension cover metal pattern ECP may be formed. Subsequently, as shown in FIG. 7B, a light emitting layer EL and a light emitting layer pattern EL_P may be simultaneously formed through the same process. Subsequently, a common electrode COM and a common electrode pattern COM_P may be simultaneously formed through the same process. Subsequently, an encapsulation layer EPAS and an encapsulation layer pattern EPAS_P may be simultaneously formed through the same process.

A light emitting display device according to an aspect of the present disclosure may be configured as follows.

A light emitting display device according to an aspect of the present disclosure may include a substrate, an auxiliary power electrode located on the substrate, a first protection layer located on the auxiliary power electrode, a second protection layer located between the first protection layer and the auxiliary power electrode, a contact portion configured to expose a part of the auxiliary power electrode through the first protection layer and the second protection layer, an eaves structure portion located at the contact portion, and a cover metal pattern located on the eaves structure portion.

In the light emitting display device according to the aspect of the present disclosure, the eaves structure portion may be made of the same material as the first protection layer.

In the light emitting display device according to the aspect of the present disclosure, the eaves structure portion may be supported by a pillar structure portion disposed between an upper surface of the auxiliary power electrode and a lower surface of the eaves structure portion, and the pillar structure portion may be made of the same material as the second protection layer.

In the light emitting display device according to the aspect of the present disclosure, the substrate may comprise an active area in which subpixels are located and a non-active area adjacent to the active area. A pad electrode electrically connected to a data driving unit to supply a data signal to the subpixels may be located in the non-active area. The cover metal pattern may be made of the same material as the pad electrode.

In the light emitting display device according to the aspect of the present disclosure, the contact portion may be located in the active area and is surrounded by the subpixels.

In the light emitting display device according to the aspect of the present disclosure, the cover metal pattern may be made of a molybdenum titanium (MoTi) alloy or indium tin oxide (Indium tin oxide).

In the light emitting display device according to the aspect of the present disclosure, the cover metal pattern may fully overlap the eaves structure portion.

In the light emitting display device according to the aspect of the present disclosure, the cover metal pattern may comprise an extension portion protruding from a side end of the eaves structure portion in a direction parallel to the substrate.

The light emitting display device according to the aspect of the present disclosure may further comprise a thin film transistor on the substrate and a connection electrode connected to the thin film transistor. The cover metal pattern may be made of the same material as the connection electrode.

The light emitting display device according to the aspect of the present disclosure may further comprise a pixel electrode on the first protection layer, a bank layer on the first protection layer, the bank layer defining an opening on the pixel electrode, a light emitting layer on the pixel electrode and the bank layer and a common electrode on the light emitting layer, the common electrode being in contact with the auxiliary power electrode at the contact portion. A light emitting layer pattern made of the same material as the light emitting layer and a common electrode pattern made of the same material as the common electrode may be sequentially stacked on the cover metal pattern.

The light emitting display device according to the aspect of the present disclosure may further comprise an encapsulation layer on the common electrode. An encapsulation layer pattern made of the same material as the encapsulation layer may be located on the common electrode pattern.

A light emitting display device according to another aspect of the present disclosure may comprise a substrate comprising an active area in which subpixels are located and a non-active area adjacent to the active area, an auxiliary power electrode located between the subpixels; and an undercut structure located on the auxiliary power electrode. The undercut structure may comprise a first pattern located on the auxiliary power electrode, a second pattern to support the first pattern and a cover metal pattern to cover an entire upper surface of the first pattern.

In the light emitting display device according to the aspect of the present disclosure, the undercut structure may have an undercut area, and the undercut area may be defined by a lower surface of the first pattern and the cover metal pattern, and a side surface of the second pattern.

The light emitting display device according to the aspect of the present disclosure may further comprise a first protection layer located on the auxiliary power electrode and a second protection layer located between the first protection layer and the auxiliary power electrode. The first and second protection layers may be spaced apart from the undercut structure, and the first and second patterns may be made of the same material as the first and second protection layers, respectively.

The light emitting display device according to the aspect of the present disclosure may further comprise a pad electrode located in the non-active area. The pad electrode may be made of the same material as the cover metal pattern.

In the light emitting display device according to the aspect of the present disclosure, the cover metal pattern may comprise an extension portion protruding from a side end of the first pattern in a direction parallel to the substrate A method of manufacturing a light emitting display device according to the aspect of the present disclosure may comprise forming an auxiliary power electrode on a substrate, forming a passivation material layer on the auxiliary power electrode, forming a first pattern and an overcoat layer on the passivation material layer, forming a cover metal material layer on the first pattern and the overcoat layer, patterning the cover metal material layer and removing the passivation material layer under the patterned cover metal material layer to form an undercut area.

The method of manufacturing a light emitting display device according to the aspect of the present disclosure may further comprise forming a photoresist pattern on the cover metal material layer overlapping the first pattern and removing the cover metal material layer not overlapping the photoresist pattern.

The method of manufacturing a light emitting display device according to the aspect of the present disclosure may further comprise performing an ashing process to form a cover metal pattern having the same width as the first pattern between the step of removing the cover metal material layer and the step of forming the undercut area.

The method of manufacturing a light emitting display device according to the aspect of the present disclosure may further comprise after the step of forming the undercut area, forming a light emitting layer on the overcoat layer and forming a light emitting layer pattern on the patterned cover metal material layer, forming a common electrode on the light emitting layer and forming a common electrode pattern on the light emitting layer pattern and forming an encapsulation layer on the common electrode and forming an encapsulation layer pattern on the common electrode pattern.

As is apparent from the above description, in a light emitting display device according to the present disclosure, it is possible to prevent loosening of the edge of an overcoat layer pattern of an undercut structure in a cathode contact structure, whereby it is possible to reduce patterning time and etching area necessary to form the undercut structure.

In addition, gas generated from a filler is captured in the undercut structure, whereby it is possible to protect a light emitting element.

In addition to the above effects of the present disclosure, other features and advantages of the present disclosure will be clearly understood by a person having ordinary skill in the art to which the present disclosure pertains from the above description.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting display device comprising:
a substrate;
an auxiliary power electrode on the substrate;
a first protection layer on the auxiliary power electrode;
a second protection layer between the first protection layer and the auxiliary power electrode;
a contact portion having an undercut area to expose a part of the auxiliary power electrode through the first protection layer and the second protection layer;
an eaves structure portion located at the contact portion;
a cover metal pattern located on the eaves structure portion;
a light emitting layer pattern located on the cover metal pattern; and
a common electrode pattern located on the light emitting layer pattern.

2. The light emitting display device of claim 1, wherein the eaves structure portion includes the same material as the first protection layer.

3. The light emitting display device of claim 2, further comprising a pillar structure portion to support the eaves structure portion between an upper surface of the auxiliary power electrode and a lower surface of the eaves structure portion, and
wherein the pillar structure portion includes the same material as the second protection layer.

4. The light emitting display device of claim 1, wherein the substrate comprises an active area in which subpixels are located and a non-active area adjacent to the active area,
wherein a pad electrode electrically connected to a data driving unit to supply a data signal to the subpixels is located in the non-active area, and
wherein the cover metal pattern is made of the same material as the pad electrode.

5. The light emitting display device of claim 4, wherein the contact portion is located in the active area and is surrounded by the subpixels.

6. The light emitting display device of claim 1, wherein the cover metal pattern is made of a molybdenum titanium (MoTi) alloy or indium tin oxide (Indium tin oxide).

7. The light emitting display device of claim 1, wherein the cover metal pattern covers an entire upper portion of the eaves structure portion.

8. The light emitting display device of claim 1, wherein the cover metal pattern comprises an extension portion protruding from a side end of the eaves structure portion in a direction parallel to the substrate.

9. The light emitting display device of claim 1, further comprising:
a thin film transistor on the substrate; and
a connection electrode connected to the thin film transistor, wherein the cover metal pattern is made of the same material as the connection electrode.

10. The light emitting display device of claim 1, further comprising:
a pixel electrode on the first protection layer;
a bank layer on the first protection layer, the bank layer defining an opening on the pixel electrode;

a light emitting layer on the pixel electrode and the bank layer; and a common electrode on the light emitting layer, the common electrode being in contact with the auxiliary power electrode at the contact portion, wherein the light emitting layer pattern is made of the same material as the light emitting layer, and wherein the common electrode pattern is made of the same material as the common electrode.

11. The light emitting display device of claim 10, further comprising:

an encapsulation layer on the common electrode, wherein an encapsulation layer pattern made of the same material as the encapsulation layer is located on the common electrode pattern.

12. A light emitting display device comprising:

a substrate comprising an active area in which subpixels are located and a non-active area adjacent to the active area;

an auxiliary power electrode located between the subpixels; an undercut structure located on the auxiliary power electrode;

a light emitting layer pattern located on the undercut structure; and a common electrode pattern located on the light emitting layer pattern, wherein the undercut structure comprises:

a top portion;

a lower portion to support the top portion; and a cover metal pattern to cover an entire upper surface of the top portion, wherein the undercut structure has an overhang area.

13. The light emitting display device of claim 12, wherein:

the overhang area is defined by a lower surface of the top portion and the cover metal pattern, and a side surface of the lower portion.

14. The light emitting display device of claim 12, further comprising:

a first protection layer located on the auxiliary power electrode; and a second protection layer located between the first protection layer and the auxiliary power electrode, wherein:

the first protection layer and the second protection layers are spaced apart from the undercut structure, and the top portion comprises the same material as the first protection layer and the lower portion comprises the same material as the second protection layers.

15. The light emitting display device of claim 14, further comprising:

a pad electrode located in the non-active area, wherein the pad electrode comprises the same material as the cover metal pattern.

16. The light emitting display device of claim 12, wherein the cover metal pattern comprises an extension portion protruding from a side end of the top portion in a direction parallel to the substrate.

17. A method of manufacturing a light emitting display device, the method comprising:

forming an auxiliary power electrode on a substrate;

forming a passivation material layer on the auxiliary power electrode;

forming a first pattern and an overcoat layer on the passivation material layer;

forming a cover metal material layer on the first pattern and the overcoat layer;

patterning the cover metal material layer;

removing the passivation material layer under the first pattern and the cover metal material layer to form an undercut area;

after forming the undercut area, forming a light emitting layer on the overcoat layer and forming a light emitting layer pattern on the patterned cover metal material layer; and forming a common electrode on the light emitting layer and forming a common electrode pattern on the light emitting layer pattern.

18. The method of claim 17, wherein patterning the cover metal material layer comprises:

forming a photoresist pattern on the cover metal material layer overlapping the first pattern; and removing the cover metal material layer based on the photoresist pattern.

19. The method of claim 18, further comprising performing an ashing process to form a cover metal pattern having the same width as the first pattern between the step of removing the cover metal material layer and the step of forming the undercut area.

20. The method of claim 17, further comprising:

forming an encapsulation layer on the common electrode and forming an encapsulation layer pattern on the common electrode pattern.

* * * * *